(12) United States Patent
Nozaki et al.

(10) Patent No.: US 7,456,103 B2
(45) Date of Patent: Nov. 25, 2008

(54) ETCH-RESISTANT FILM, FORMING METHOD THEREOF, SURFACE-MODIFIED RESIST PATTERN, FORMING METHOD THEREOF, SEMICONDUCTOR DEVICE AND MANUFACTURING METHOD THEREOF

(75) Inventors: Koji Nozaki, Kawasaki (JP); Masayuki Takeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/205,992

(22) Filed: Aug. 18, 2005

(65) Prior Publication Data

US 2005/0269290 A1    Dec. 8, 2005

Related U.S. Application Data

(63) Continuation of application No. PCT/JP03/02324, filed on Feb. 28, 2003.

(51) Int. Cl.
 *H01L 21/302* (2006.01)
(52) U.S. Cl. .......................................... 438/689; 216/67
(58) Field of Classification Search ................. 427/240; 438/689
 See application file for complete search history.

(56) References Cited

U.S. PATENT DOCUMENTS

| | | | |
|---|---|---|---|
| 4,335,161 A * | 6/1982 | Luo ............................ | 438/164 |
| 4,609,426 A * | 9/1986 | Ogawa et al. .................. | 216/60 |
| 4,721,553 A * | 1/1988 | Saito et al. ............. | 204/192.12 |
| 5,016,564 A * | 5/1991 | Nakamura et al. ... | 118/723 MR |
| 5,362,606 A * | 11/1994 | Hartney et al. .............. | 430/315 |
| 6,846,360 B2 * | 1/2005 | Lei .............................. | 118/50 |
| 2002/0031729 A1 * | 3/2002 | Trefonas et al. ............. | 430/322 |

FOREIGN PATENT DOCUMENTS

| | | |
|---|---|---|
| JP | 64-8261 | 1/1989 |
| JP | 01-123232 | 5/1989 |
| JP | 04-111423 | 4/1992 |
| JP | 4-240729 | 8/1992 |

(Continued)

OTHER PUBLICATIONS

Beiderman; Plasma Polymer Prepared by Rf Sputtering; IEEE; 1999.*

(Continued)

*Primary Examiner*—Keith D. Hendricks
*Assistant Examiner*—Patricia George
(74) *Attorney, Agent, or Firm*—Westerman, Hattori, Daniels & Adrian, LLP.

(57) ABSTRACT

The present invention provides a surface-modified resist pattern which contains a resist pattern having low etch resistance by itself but having a modified and etch-resistant surface and is suitable for fine and high-definition patterning, and a method for efficiently forming the same. The method forms a surface-modified resist pattern having an etch-resistant surface by selectively depositing an organic compound on a resist pattern. The deposition is preferably carried out by using plasma of a gas. The method preferably includes arranging the organic compound so as to face the resist pattern, the organic compound having been deposited on a base material, and depositing the organic compound onto the resist pattern. The plasma of the gas is preferably introduced from an opposite side of the base material to the organic compound deposited thereon.

18 Claims, 20 Drawing Sheets

FOREIGN PATENT DOCUMENTS

| | | | |
|---|---|---|---|
| JP | 04-240729 | | 8/1992 |
| JP | 07-153667 | * | 11/1993 |
| JP | 08-131720 | * | 11/1993 |
| JP | 7-153667 | | 6/1995 |
| JP | 07-153667 | * | 2/1996 |
| JP | 8-31720 | | 2/1996 |
| JP | 08-031720 A | * | 2/1996 |
| KR | 1020010037049 A | | 5/2001 |

OTHER PUBLICATIONS

Nalamasu; Resist Design Concepts for 193 nm Optical Lithography . . . ; Jul. 1, 2000; Future Fab Intl. vol. 8; Bell Lab.; AH Gabor, Arch Chemicals.*

Quan; Polymer like organic thin films deposited by PECVD . . . ; J. Appl. Phys. vol. 38; 1999; pp. 1356-1358.*

Korean Office Action dated Aug. 28, 2006 issued in corresponding Korean Application No. 10-2005-701039.

Japanese Office Action dated Jul. 22, 2008 of JP 2004-568762.

Japanese Office Action dated Jul. 22, 2008 of JP 2004-568762.

* cited by examiner

FIG. 4
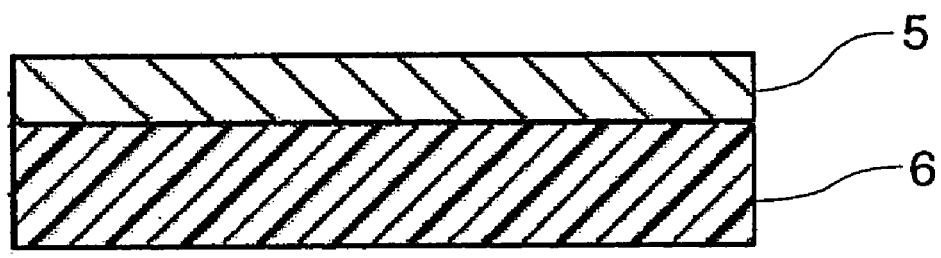
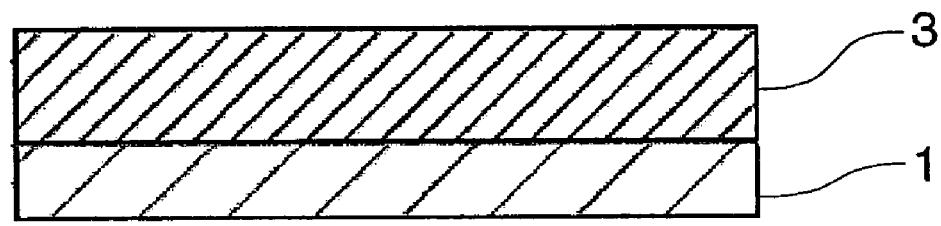

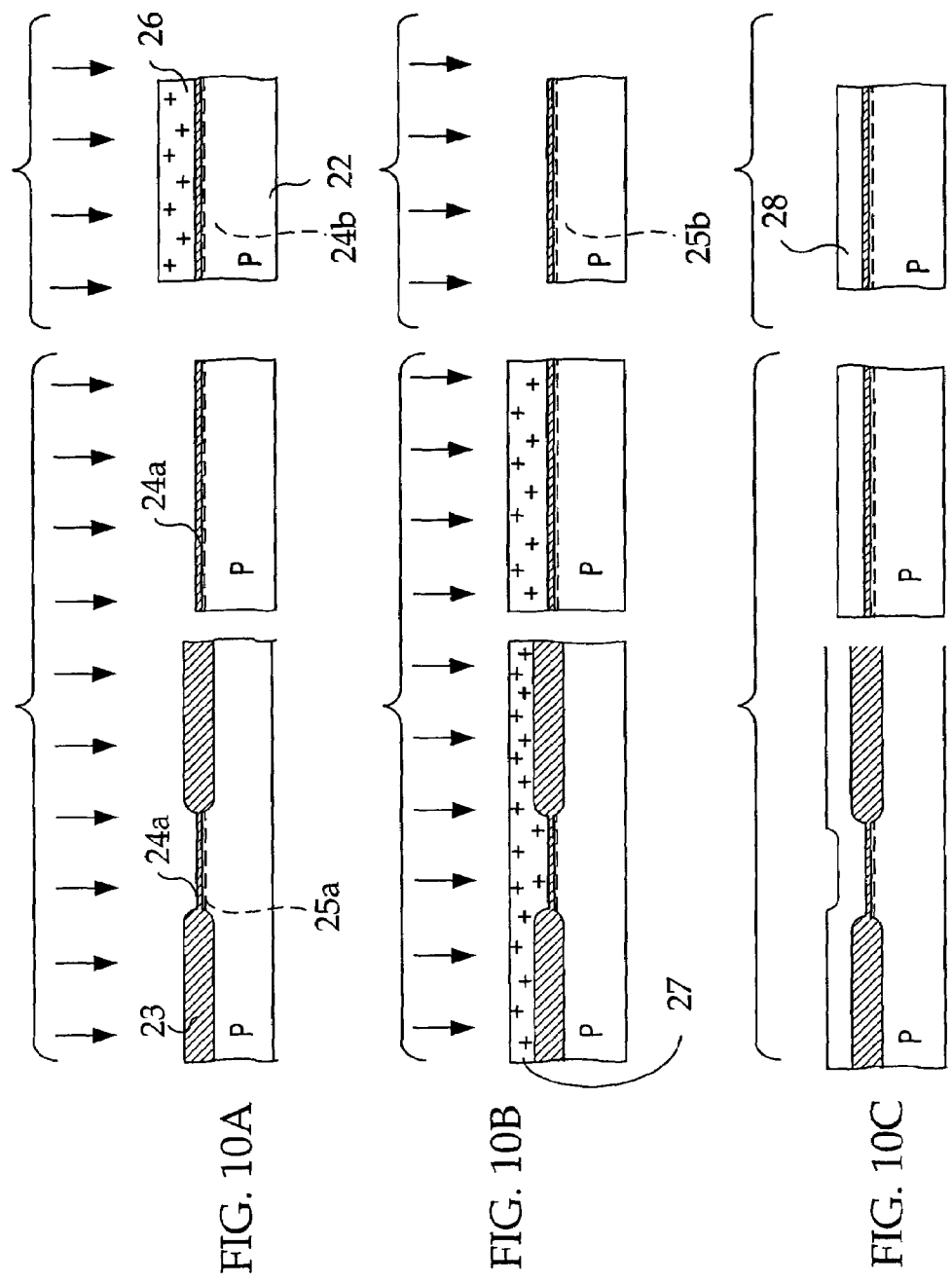

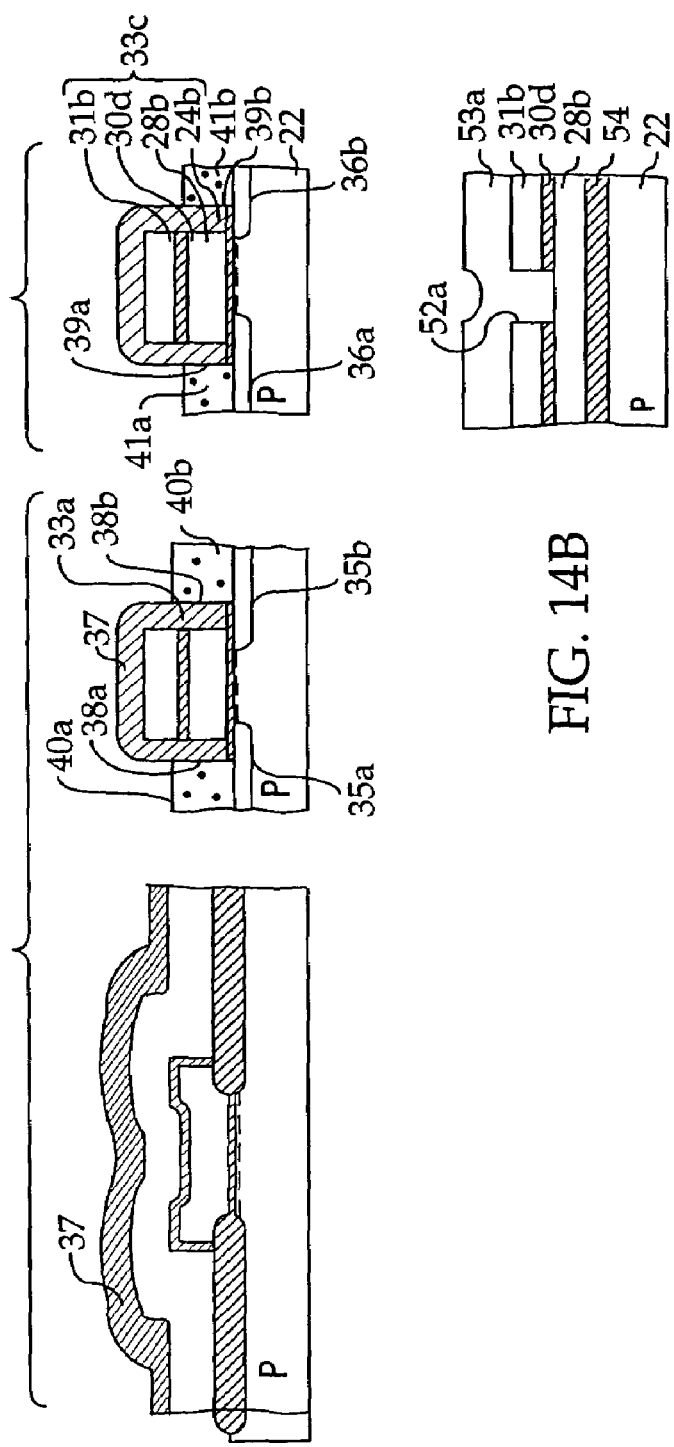
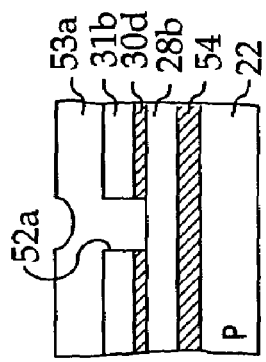
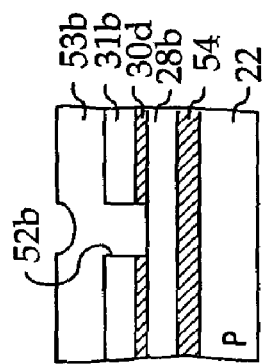
FIG. 14A
FIG. 14B
FIG. 14C

ETCH-RESISTANT FILM, FORMING METHOD THEREOF, SURFACE-MODIFIED RESIST PATTERN, FORMING METHOD THEREOF, SEMICONDUCTOR DEVICE AND MANUFACTURING METHOD THEREOF

CROSS-REFERENCE TO RELATED APPLICATIONS

This is a continuation of Application PCT/JP2003/002324, filed on Feb. 28, 2003.

BACKGROUND OF THE INVENTION

1. Field of the Invention

The present invention relates to improvements in etch resistance of a surface of a workpiece, such as a surface of a resist film or of a resist pattern for fine patterning. More specifically, it relates to an etch-resistant film that can be arranged typically as an etch-resistant masking material on an underlying layer having low etch resistance, and a method for efficiently forming the same; a surface-modified resist pattern that includes a resist pattern having low etch resistance and a modified surface having high etch resistance and is suitable for fine and high-definition patterning, and a method for efficiently forming the same; and a semiconductor device that has a fine and high-definition wiring pattern and exhibits high performance and high quality, and a method for efficiently manufacturing the same.

2. Description of the Related Art

Smaller semiconductor integrated circuits (large scale integrated circuits; LSI) translate shorter wavelength of irradiating light sources. For example, argon fluoride (ArF) excimer laser having a wavelength of 193 nm is used in 90 nm-node devices. With shorter wavelengths of irradiating light sources, acrylic materials having higher transparency in the region of shorter wavelengths than conventional phenol materials have been increasingly used as resist materials for fine patterning. Fluorine ($F_2$) excimer laser having a wavelength of 157 nm will be used for 65 nm-node devices in the future, and fluorine-containing norbornene resists and acrylic resists have been increasingly developed as resist materials enabling such fine patterning.

These resists for use in argon fluoride (ArF) excimer laser lithography, such as acrylic resists and norbornene resists for corresponding shorter wavelengths, however, are inferior in plasma-etch resistance in processing to conventional phenolic resists. To improve the etch resistance of such a resist for use in argon fluoride (ArF) excimer laser lithography, therefore, introduction of a polycyclic alicyclic compound having a low absorption coefficient in the region of wavelength in lithography into a base resin of the resist has been proposed. The resulting resist, however, cannot significantly have transparency and etch resistance equivalent to those of the conventional phenolic resists. The resists typically for use in argon fluoride (ArF) excimer laser lithography have insufficient etch resistance and must employ complicated processes using, for example, a tri-level (three-layered) hard mask in processing of LSI. A two-level (two-layer) resist process using a Si-containing resist is also known as an alternative solution of the complicated multi-level process. This technique, however, invites a residue typically of $SiO_2$ remained in the Si-containing layer after etching and has not yet been used in practice. In contrast, a technique of depositing a silicone resin on a resist by application of ion beams has been proposed (e.g., Japanese Patent Application Laid-Open (JP-A) No. 08-31720), but it also invites a residue after etching, as in the two-layer resist process.

No technique has been provided to improve the etch resistance of a surface of a workpiece, such as a surface of a resist film or a surface of a resist pattern for fine patterning, without inviting unnecessary residues during etching. In addition, no technique has been provided to carry out etching using a resist for use in argon fluoride (ArF) excimer laser lithography as a mask without requiring complicated processes.

Accordingly, an object of the present invention is to provide an etch-resistant film that can be suitably arranged typically as a masking material against etching on an underlying layer (surface of a workpiece) having low etch resistance, and a method for efficiently forming the same.

Another object of the present invention is to provide a surface-modified resist pattern which contains a resist pattern having low etch resistance but having a modified and etch-resistant surface and is suitable for fine and high-definition patterning, and a method for efficiently forming the same.

Yet another object of the present invention is to provide a semiconductor device having a fine and high-definition wiring pattern and exhibiting high performance and high quality, and a method for efficiently manufacturing the same.

SUMMARY OF THE INVENTION

The present invention provides a method for forming a surface-modified resist pattern having an etch-resistant surface, comprising the step of selectively depositing an organic compound on a resist pattern. The method forms a film having etch resistance on a surface of the resist pattern to thereby provide a surface-modified resist pattern having an etch-resistant surface. The method for forming a surface-modified resist pattern of the present invention produces a surface-modified resist pattern having a surface with further improved etch resistance, for example, by selectively depositing an aromatic resin such as a phenolic resin as the organic compound on a resist pattern for use in ArF excimer laser, i.e., a resist pattern generally believed to have low etch resistance.

The present invention further provides a surface-modified resist pattern formed by the method for forming a surface-modified resist pattern. The resulting surface-modified resist pattern has a modified and etch-resistant surface and is advantageously used typically for pattering by etching an underlying layer using the resist pattern as a mask and serves to carry out fine and high-definition patterning.

The present invention further provides a method for forming an etch-resistant film having an etch-resistant surface, comprising the step of selectively depositing an organic compound on a workpiece. The method forms an etch-resistant film on a surface of the workpiece. Thus, a desired region to be resistant against etching can have an etch-resistant film in a desired shape and have significantly improved durability and life. The method for forming an etch-resistant film can selectively form an etch-resistant film in a desired shape and can thereby easily form a film in a desired shape, such as an interlayer dielectric film in a semiconductor device. The etch-resistant film formed by the method for forming an etch-resistant film of the present invention is typically advantageous for use under such conditions as to require etch resistance.

In addition, the present invention provides an etch-resistant film being arranged as a surface layer on an underlying layer, wherein the ratio of the etching rate (nm/s) of the underlying layer to the etching rate (nm/s) of the surface layer determined under the same condition is 1.1 or more. The etch-resistant film has relatively higher etch resistance than that of the underlying layer and is typically advantageous for use under such conditions as to require etch resistance.

The present invention further provides a method for manufacturing a semiconductor device, comprising the step of modifying a surface of a resist pattern by forming a resist pattern on an underlying layer, and then by selectively depositing an organic compound on the resist pattern to thereby form a surface-modified resist pattern; and the step of patterning the underlying layer by etching using the surface-modified resist pattern as a mask. According to the method for manufacturing a semiconductor device, a resist pattern is formed on the underlying layer, and an organic compound is selectively deposited on the resist pattern to thereby form a surface-modified resist pattern in the step of hardening a surface of a resist pattern. The underlying layer is then patterned by etching with the use of the surface-modified resist pattern as a mask in the step of patterning. As a result, a fine and high-definition wiring pattern, for example, is formed on the underlying layer.

In addition and advantageously, the present invention provides a semiconductor device manufactured by the method for manufacturing a semiconductor device. The resulting semiconductor device manufactured by the method has, for example, a fine and high-definition wiring pattern, is of high quality and can be advantageously used in various applications and regions.

BRIEF DESCRIPTION OF THE DRAWINGS

FIG. 4 is a schematic diagram (part one) illustrating an embodiment of steps in the method for forming an etch-resistant film of the present invention, in which an organic compound deposited on a base material is arranged so as to face a workpiece in a plasma atmosphere.

FIGS. 10A, 10B and 10C are schematic sectional views (part one) illustrating a method for manufacturing a FLASH EPROM as an embodiment of the method for manufacturing a semiconductor device of the present invention.

FIGS. 14A, 14B and 14C schematic sectional views illustrating a method for manufacturing a FLASH EPROM as yet another embodiment of the method for manufacturing a semiconductor device of the present invention.

Figure 1:
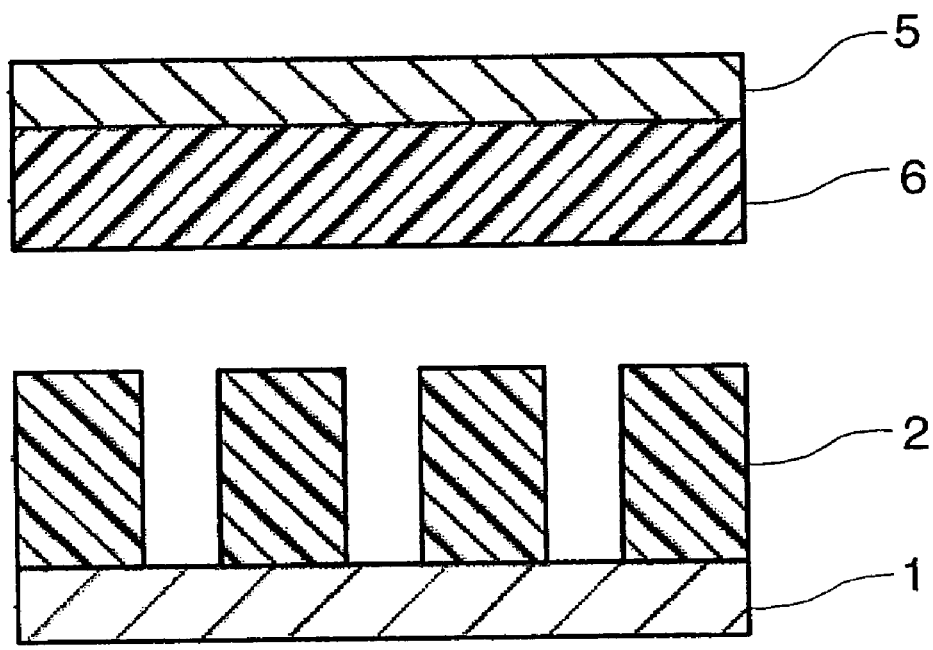
FIG. 1 is a schematic diagram (part one) illustrating an embodiment of steps in the method for forming a surface-modified resist pattern of the present invention, in which an organic compound deposited on a base material is arranged so as to face a resist pattern in a plasma atmosphere.

DESCRIPTION OF THE PREFERRED EMBODIMENTS (Surface-Modified Resist Pattern and Formation Thereof, Etch-Resistant Film and Formation Thereof)

The method for forming a surface-modified resist pattern of the present invention is a method for forming a surface-modified resist pattern having an etch-resistant surface, comprising the step of selectively depositing an organic compound on a resist pattern. The method for forming an etch-resistant film of the present invention is a method for forming an etch-resistant film having an etch-resistant surface, comprising the step of selectively depositing an organic compound on a workpiece. The method for forming a surface-modified resist pattern and the method for forming an etch-resistant film differ from each other in that a target on which the organic compound is to be deposited is the resist pattern in the former method and is the surface of the workpiece in the latter method.

The resulting surface-modified resist pattern formed by the method for forming a surface-modified resist pattern of the present invention has etch resistance. The etch resistance herein may be derived typically from the organic compound having etch resistance itself or may be developed as a result of the deposition of the organic compound, even if the organic compound itself does not have etch resistance. The etch-resistant film formed by the method for forming an etch-resistant film has etch resistance. Likewise, the etch resistance herein may be derived typically from the organic compound having etch resistance itself or may be developed as a result of the deposition of the organic compound, even if the organic compound itself does not have etch resistance.

The surface-modified resist pattern of the present invention is advantageously prepared by the method for forming a surface-modified resist pattern of the present invention. The etch-resistant film of the present invention is advantageously prepared by the method for forming an etch-resistant film of the present invention. The surface-modified resist pattern and the etch-resistant film will be illustrated below with reference to the description of the method for forming a surface-modified resist pattern and the method for forming an etch-resistant film.

Organic Compound

The organic compound is not specifically limited, can be appropriately selected according to the purpose, but it is preferred that the organic compound itself has etch resistance. Preferred examples are those containing at least one of a cyclic hydrocarbon structure and a heterocyclic structure.

Specific examples of the organic compound are novolak resins, polyvinylphenol resins, polystyrene resins, vinyl benzoate resins, polyvinylpyridine resins, polynorbornene resins, polyvinyladamantane resins, poly(p-hydroxyphenyl acrylate)s, poly(p-hydroxyphenyl methacrylate)s, derivatives and copolymers thereof.

Each of these can be used alone or in combination. Among them, at least one selected from novolak resins, polyvinylphenol resins and polystyrene resins is preferred.

The organic compound is not limited to polymer compounds such as the above-listed resins and can be any low-molecular compound. When the organic compound is a polymer compound, the weight-average molecular weight (Mw) thereof is preferably from 500 to 500,000 and more preferably from 1,000 to 100,000.

The organic compound is preferably an organic compound having etch resistance itself, as described above. It can be, however, an organic compound inherently having no etch resistance but being added with an etch-resistant compound. In this case, the organic compound can be, for example, a resin having no etch resistance by itself but containing an etch-resistant compound combined to a side chain thereof. The resin having no etch resistance is not specifically limited and includes, for example, known general-purpose resins.

The etch-resistant compound can be freely selected according to the purpose and includes, for example, aromatic compounds, alicyclic compounds and heterocyclic compounds. Each of these can be used alone or in combination.

Examples of the aromatic compounds are benzene derivatives.

Examples of the alicyclic compounds are cycloalkanes.

The heterocyclic compounds include, for example, nitrogen-containing cyclic compounds such as pyrrolidine, pyridine, imidazole, oxazole, morpholine and pyrrolidone; and oxygen-containing cyclic compounds such as furan, pyran, and polysaccharides including pentoses and hexoses.

When the organic compound is a resin having no etch resistance by itself but containing an etch-resistant compound combined to a side chain thereof, the molar content of the etch-resistant compound can be freely set according to the purpose and is preferably 5 percent by mole or more, and more preferably 10 percent by mole or more, if high etch resistance is required. The molar content can be determined, for example, by NMR.

If the organic compound itself has etch resistance, the etch resistance is not specifically limited, as long as it is higher than that of an underlying layer on which a film of the organic compound is to be formed, such as a surface of a workpiece or a resist pattern. The ratio of the etching rate (nm/s) of the underlying layer to that of the organic compound is preferably 1.1 or more, more preferably 1.2 or more, and specifically preferably 1.3 or more.

The etching rate (nm/s) can be determined, for example, by measuring a reduction of a sample film using a conventional etching system after etching for a predetermined time, and calculating a reduction per unit time.

The organic compound may further comprise any other components selected according to the purpose, within ranges not deteriorating the advantages of the present invention.

Resist Pattern and Workpiece Surface

The material for the resist pattern can be any one freely selected according to the purpose from among known resist materials and can be any of negative working resists and positive working resists. Suitable examples thereof are g-line resists, i-line resists, KrF resists, ArF resists, $F_2$ resists and electron beam resists which can be patterned upon application with g-line, i-line, KrF excimer laser, ArF excimer laser, $F_2$ excimer laser and electron beam, respectively. These resists may be chemically amplified resists or non-chemically amplified resists.

Among these materials for resist pattern, materials each comprising at least one nonaromatic resin are preferred, of which ArF resists and $F_2$ resists of these materials are more preferred, for fine patterning. Alicyclic resins are preferred as the nonaromatic resins, of which acrylic resins, norbornene resins and fluorine-containing resins are preferred.

Suitable specific examples of the material for the resist pattern are novolak resists, polyhydroxystyrene (PHS) resists, acrylic resists, acrylic resists having adamantyl group in a side chain, cycloolefin-maleic anhydride (COMA) resists, cycloolefin resists and hybrid (alicyclic acrylic-COMA copolymers) resists, for the ArF resists; and fluorinated norbornene resists, fluorinated acrylic resists, and cyanated acrylic resists, for the $F_2$ resists. These may be, for example, modified with fluorine.

The formation method, size, thickness and other parameters of the resist pattern can be appropriately set according to the purpose. The resist pattern can be formed by any known method. A desired pattern can be obtained, for example, by applying a coating composition containing the material for resist pattern, i.e., the resist material to an underlying layer, such as a surface of a substrate, selectively exposing the applied film to light, developing the same, and prebaking and/or post-exposure baking the same according to necessity.

The underlying layer can be freely selected according to the purpose. Examples thereof are various substrates, of which those to be subjected to patterning by etching, including substrates such as silicon wafers and various oxide films, are preferred.

The exposure can be freely carried out using, for example, a known light source and an exposure system.

The development can be carried out by any procedure such as a known alkali development process.

The prebaking and the post-exposure baking can be carried out under any conditions. For example, the temperature is from about 70° C. to about 150° C. and preferably from 90° C. to 130° C. The time is from about 10 seconds to about 5 minutes, and preferably from 40 seconds to 100 seconds.

The thickness of the resist pattern is not restricted, may be appropriately set depending typically on the underlying layer to be worked and etching conditions and is generally from about 0.1 to about 500 μm.

The workpiece surface can be freely and appropriately selected according to the purpose and includes, for example, various surfaces, such as a surface to be patterned, a surface to be etched, a surface to have improved durability, and a surface to be coated by a dry process.

Deposition

The organic compound can be deposited by any procedure appropriately selected according to the purpose and preferably by using plasma of a dielectric gas.

When the organic compound is deposited by using the plasma of a dielectric gas, the target on which the organic compound is to be deposited, i.e., the surface of the resist pattern and the workpiece surface should preferably be prevented from etching by the plasma.

A method for preventing the resist pattern surface and the workpiece surface from etching by the plasma is not specifically limited, can be selected according to the purpose, and a suitable example thereof is a method in which the organic compound previously deposited on a base material is arranged so as to face the resist pattern or the workpiece in the presence of plasma. In this case, the organic compound is preferably previously deposited on the base material, for protecting the resist pattern or the workpiece from etching by the plasma.

The base material can be any suitable one selected according to the purpose and is preferably one capable of masking or screening the plasma, such as a ceramic. The base material can have any suitable shape selected according to the purpose and is preferably in the form of a substrate (board). The base material may have one or more patterned through holes. When the base material has one or more through holes, the deposition may be efficiently carried out.

The plasma of a dielectric gas can be generated and introduced by any known procedures.

The plasma can be suitably generated, for example, by using a known plasma generator with the use typically of reactive ion etching (RIE), inductively coupled plasma (ICP) or helicon.

The plasma is preferably introduced from the base material side, i.e., the side opposite to the deposited organic compound when the organic compound deposited on the base material is arranged so as to face the resist pattern surface or the workpiece surface.

The plasmatic source gas can be freely and suitably selected according to the purpose from among known gases, such as oxygen, Freon, argon and nitrogen. Each of these can be used alone or in combination.

The distance (gap) between the organic compound deposited on the base material and the resist pattern or the workpiece when they are arranged so as to face each other can be freely and appropriately set according typically to the sizes of the base material and the resist pattern or the workpiece surface and is, for example, preferably from 1 to 50,000 μm, and more preferably from 10 to 1,000 μm.

If the distance (gap) is out of the above-specified range, the deposition may not be carried out efficiently.

The method for forming a surface-modified resist pattern of the present invention produces the surface-modified resist pattern of the present invention, and the method for forming an etch-resistant film of the present invention produces the etch-resistant film of the present invention.

The surface-modified resist pattern of the present invention constitutionally comprises a film or layer of the deposited organic compound (hereinafter referred to as "hard surface layer") on a surface corresponding to the top when the base material such as a substrate on which the resist pattern is formed is arranged at the bottom, i.e., on a surface excluding the wall of the resist pattern.

Whether or not the hard surface layer contains the organic compound can be determined, for example, by analyzing an infrared (IR) spectrum of the hard surface layer.

The shape, structure, thickness, size and other parameters of the hard surface layer in the surface-modified resist pattern of the present invention, or of the etch-resistant film of the present invention can be freely and appropriately set according to the purpose. The shape includes, for example, a flat film shape or a patterned shape. The structure includes, for example, a single-layer structure or a multilayer structure formed by using each of the organic compounds alone or in combination. The thickness and the size can be set according typically to the conditions in subsequent etching process.

The etch resistance of the hard surface layer in the surface-modified resist pattern of the present invention, or of the etch-resistant film of the present invention is not specifically limited. The ratio of the etching rate (nm/s) of the resist pattern as an underlying layer below the hard surface layer to the etching rate (nm/s) of the hard surface layer determined under the same condition, or the ratio of the etching rate (nm/s) of the underlying layer to the etching rate (nm/s) of the etch-resistant film determined under the same condition is preferably 1.1 or more, more preferably 1.2 or more, and specifically preferably 1.3 or more.

The etching rate (nm/s) can be determined, for example, by measuring a reduction of a sample film using a conventional etching system after etching for a predetermined time, and calculating a reduction per unit time.

An embodiment of the method for forming a surface-modified resist pattern of the present invention will be illustrated below, with reference to the drawings.

With reference to FIG. 1, a coating composition comprising a dissolved resist material such as the ArF resist is applied to a base layer (base) 1 to form a resist film. The resist film is exposed to imagewise irradiation in a desired shape, developed and prebaked to form a resist pattern 2. A layer (film) 6 of the organic compound such as a novolak resin, a polyvinylphenol resin or a polystyrene resin is previously deposited on a substrate 5 such as a silicon substrate (hereinafter this laminate is referred to as "target"), and the target is arranged so as to face the top (a region excluding the wall) of the resist pattern at a predetermined distance (gap) in a parallel plate reactive ion etching system. The plasma of the dielectric gas, such as $O_2$ gas, is introduced from the opposite side of the substrate 5 to the organic compound layer (film) 6, i.e., from the side from which the substrate 5 is exposed.

Figure 2:
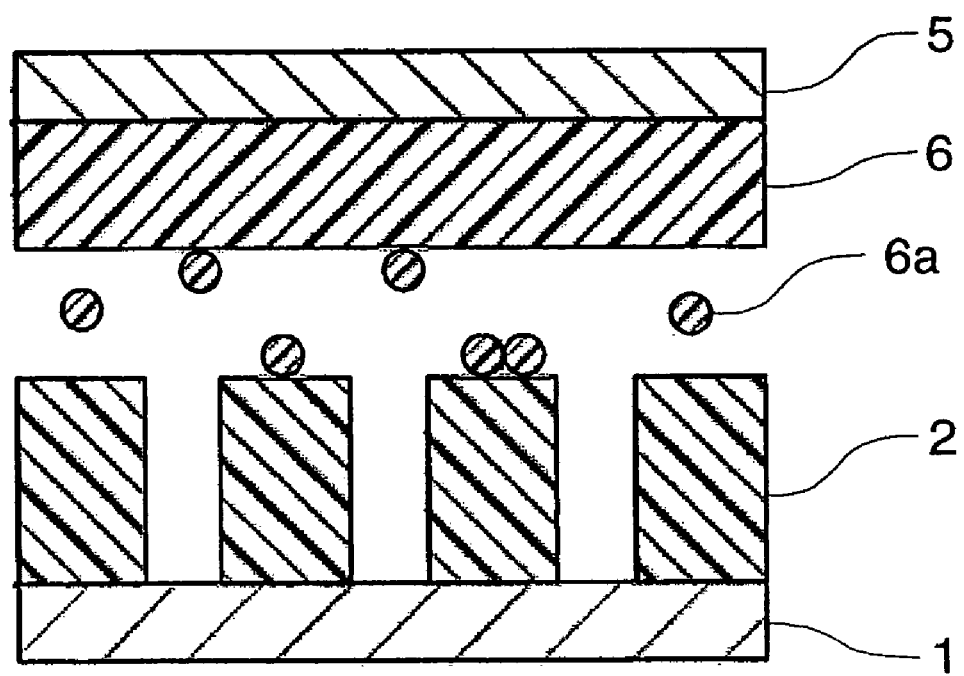
FIG. 2 is a schematic diagram (part two) illustrating the embodiment of steps in the method for forming a surface-modified resist pattern of the present invention, in which the organic compound deposited on the base material is moving toward the resist pattern to be deposited thereon.

With reference to FIG. 2, the plasma gradually moves toward the resist pattern 2, but is prevented from moving (masked) by the substrate 5 when it reaches the substrate 5. The plasma masked by the substrate 5 turns around to the front side of the organic compound layer (film) 6, part of which comes into contact with the surface of the organic compound layer (film) 6 to release a particle 6a of the organic compound from the surface of the organic compound layer (film) 6. When the organic compound layer (film) 6 is arranged above the resist pattern 2, the particle 6a of the organic compound moves toward the top of the resist pattern 2 (the surface of the resist pattern excluding the wall). The moved particle 6a of the organic compound is deposited on the top of the resist pattern 2 (the surface of the resist pattern excluding the wall) by the interaction with the resist pattern 2 without being deposited on the base layer (base) 1.

Figure 3:
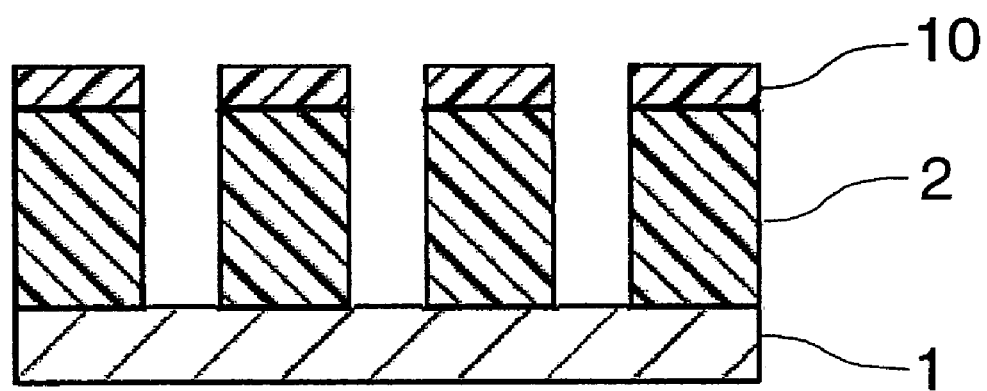
FIG. 3 is a schematic diagram (part three) illustrating the embodiment of steps in the method for forming a surface-modified resist pattern of the present invention, in which the organic compound is deposited on the resist pattern.

After the elapse of a predetermined time (e.g., five minutes), the organic compound is deposited on the top of the resist pattern 2 (the surface of the resist pattern excluding the wall) to form an etch-resistant hard surface layer 10 (FIG. 3). The resist pattern having the hard surface layer 10 on its surface is the surface-modified resist pattern of the present invention. The surface-modified resist pattern has the etch-resistant hard surface layer 10, thereby exhibits improved etch resistance and can be subjected to etching even if the resist pattern as the underlying layer below the hard surface layer 10 comprises a material having low etch resistance, such as an ArF resist.

An embodiment of the method for forming an etch-resistant film of the present invention will be illustrated below, with reference to the drawings.

Figure 5:
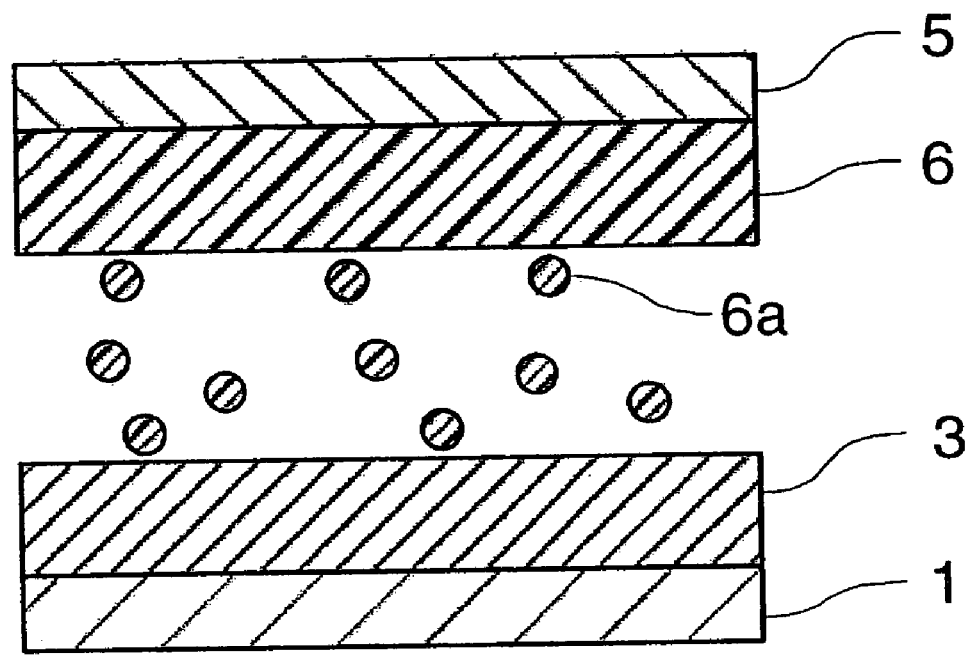
FIG. 5 is a schematic diagram (part two) illustrating the embodiment of steps in the method for forming an etch-resistant film of the present invention, in which the organic compound leaves from the base material and moves toward the workpiece to be deposited thereon.

The embodiment shown in FIGS. 4 and 5 is different from the embodiment shown in FIGS. 1 and 2 in that not the resist pattern 2 but a resin layer (film) 3 having no etch resistance is formed as the workpiece surface on the base layer (base) 1. The operation and advantages of the embodiment herein are the same as those of the embodiment shown in FIGS. 1 and 2. More specifically, a released particle 6a of the organic compound moves toward the resin layer (film) 3 having no etch resistance by the action of the plasma. The moved particle 6a of the organic compound is deposited on the surface of the resin layer (film) 3 having no etch resistance by the interaction therewith to form an etch-resistant film, without being deposited on the base layer (base) 1.

Another embodiment of the method for forming an etch-resistant film of the present invention will be illustrated below, with reference to the drawings.

Figure 6:
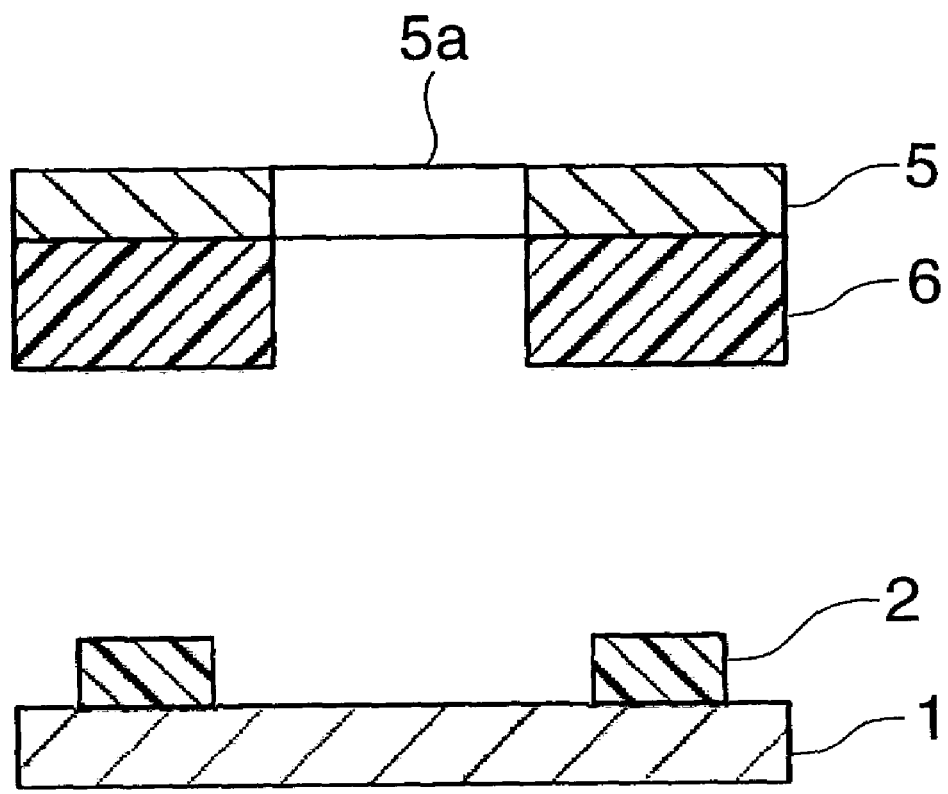
FIG. 6 is a schematic diagram (part one) illustrating another embodiment of steps in the method for forming a surface-modified resist pattern of the present invention, in which an organic compound deposited on a base material having a patterned through hole is arranged so as to face a resist pattern in a plasma atmosphere.
Figure 7:
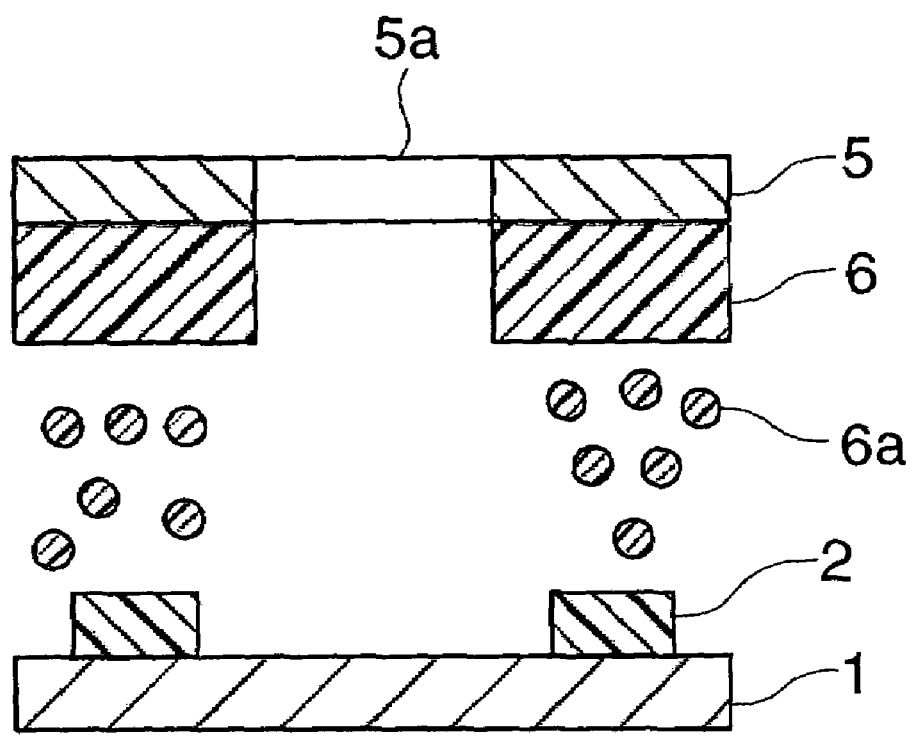
FIG. 7 is a schematic diagram (part two) illustrating the embodiment of steps in the method for forming a surface-modified resist pattern of the present invention, in which the organic compound leaves from the base material having a patterned through hole and moves toward the resist pattern to be deposited thereon.
Figure 8:
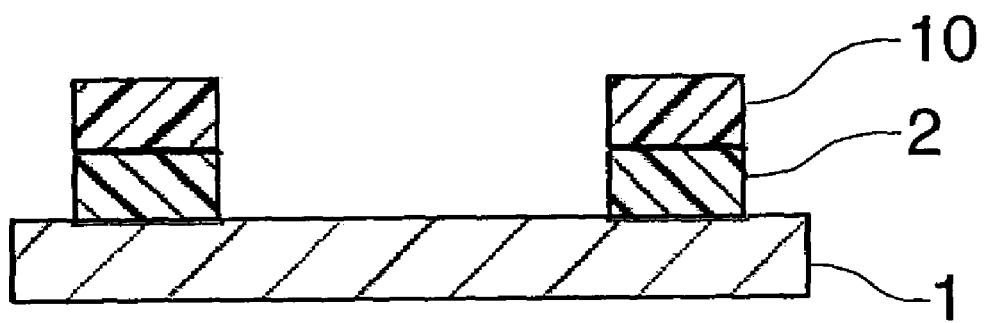
FIG. 8 is a schematic diagram (part three) illustrating the embodiment of steps in the method for forming a surface-modified resist pattern of the present invention, in which the organic compound is deposited on the resist pattern.

The embodiment shown in FIGS. 6, 7 and 8 is different from the embodiment shown in FIGS. 1, 2 and 3 in that the substrate 5 bearing the etch-resistant film (layer) 6 has a patterned through hole, but exhibits the same operation and advantages as in the embodiment shown in FIGS. 1, 2 and 3. More specifically, a released particle 6a of the organic compound moves toward the resist pattern 2 by the action of the plasma. The moved particle 6a of the organic compound is deposited on the surface of the resist pattern 2 by the interaction with the resist pattern 2 to form an etch-resistant hard surface layer 10, without being deposited on the base layer (base) 1.

The surface-modified resist pattern of the present invention prepared by the method for forming a surface-modified resist pattern of the present invention can be advantageously used, for example, as mask patterns; reticle patterns; in functional parts such as magnetic heads, liquid crystal displays (LCDs), plasma display panels (PDPs) and surface acoustic wave filters (SAW filters); optical parts used for connection of optical wiring; fine parts such as microactuators; and semiconductor devices such as flash memories, DRAMs and FRAMs. It can also be advantageously used in the after-mentioned semiconductor device and the manufacturing method thereof according to the present invention.

The etch-resistant film of the present invention prepared by the method for forming an etch-resistant film of the present invention can be advantageously used in a variety of fields as, for example, a mask in patterning, a protective film in etching, a protective film for improving durability, and an interlayer dielectric film in a semiconductor device.

The above-described method for forming a surface-modified resist pattern and the method for forming an etch-resistant film of the present invention can be specifically advantageously used in the following semiconductor device and the manufacturing method thereof according to the present invention.

(Semiconductor Device and Manufacturing Manufacture Method Thereof)

The semiconductor device of the present invention is not specifically limited, as long as it comprises at least a pattern prepared by using the surface-modified resist pattern of the present invention, and may further comprise any known member(s) selected according to the purpose.

Suitable specific examples of the semiconductor device of the present invention are flash memories, DRAMs and FRAMs.

The semiconductor device of the present invention can be advantageously manufactured by the method for manufacturing a semiconductor device of the present invention mentioned below.

The method for manufacturing a semiconductor device of the present invention comprises the step of forming a surface-modified resist pattern and the step of patterning and may further comprise any other steps selected according to necessity.

In the step of forming a surface-modified resist pattern, the resist pattern is formed on the underlying layer (base layer), and the organic compound is selectively deposited on the resist pattern to thereby form a surface-modified resist pattern.

The organic compound is as defined above. The underlying layer or base layer is as described above and includes, for example, surface layers of parts in a semiconductor device, of which a substrate such as a silicon wafer or a surface layer thereof is preferred. The resist pattern and formation thereof are as described above.

In the patterning step, the underlying layer is patterned by etching with the use of the surface-modified resist pattern as a mask.

The etching can be carried out by any procedure selected according to the purpose from known procedures and is preferably carried out by dry etching. Conditions for the etching can be freely and appropriately set according to the purpose.

The present invention will be illustrated in further detail with reference to several examples below, which are never intended to limit the scope of the present invention.

EXAMPLE 1

An alicyclic acrylic resist (ArF resist) was applied to a silicon nitride (SiN) substrate as the underlying layer and was baked to form a resist film 0.3 μm thick thereon. The resist film was irradiated with light using an ArF excimer laser system having a numerical aperture (NA) of 0.68 and was developed with a 2.38% tetramethyl ammonium hydroxide (TMAH) to yield a 150-nm line-and-space pattern.

Separately, a layer (film) of a polyvinylphenol resin (MARUKALINKER M, available from Maruzen Petrochemical Co., Ltd.) was prepared as the target to a thickness of 1 μm on a silicon substrate by application and baking at 110° C. for 60 seconds. The target was arranged over the line-and-space pattern so as to face each other at a distance (gap) of 600 μm in a chamber of an ICP etching system. Plasma was then generated for five minutes at a platen applied voltage of 10 W, a coil applied voltage of 60 W, a flow rate of $O_2$ gas of 100 sccm and a pressure of 0.2 mTorr, and the SiN substrate bearing the line-and-space pattern was taken out.

The SiN substrate bearing the line-and-space pattern was divided, and the section of the line-and-space pattern was observed to find that a layer (film) of the polyvinylphenol resin as the hard surface layer was deposited selectively on the resist pattern alone. The thickness of the layer (film) of the polyvinylphenol resin was 0.1 μm.

EXAMPLE 2

The procedure of Example 1 was repeated, except for using a novolak resist (PFI-55, available from Sumitomo Chemical Co., Ltd.) instead of the polyvinylphenol resin. The resulting SiN substrate bearing the line-and-space pattern was divided, and the section of the line-and-space pattern was observed to find that a layer (film) of the novolak resin as the hard surface layer was deposited selectively on the resist pattern alone. The thickness of the layer (film) of the novolak resin was 0.12 μm.

EXAMPLE 3

The procedure of Example 1 was repeated, except for using a COMA resist (ArF resist) instead of the alicyclic acrylic resist. The resulting SiN substrate bearing the line-and-space pattern was divided, and the section of the line-and-space pattern was observed to find that a layer (film) of the polyvinylphenol resin as the hard surface layer was deposited selectively on the resist pattern alone. The thickness of the layer (film) of the polyvinylphenol resin was 0.12 μm.

EXAMPLE 4

An exposed area of the SiN substrate having the line-and-space pattern bearing the layer (film) of the polyvinylphenol resin as the hard surface layer deposited on its suface prepared according to Example 1 was etched 70 nm using a RIE system at a flow rate of $CHF_3$ of 20 sccm, a flow rate of $O_2$ of 20 sccm, a flow rate of Ar of 130 sccm, a pressure of 15 mT and a power of radio frequency of 200 W. As a result, the resist pattern bearing the layer (film) of the polyvinylphenol resin as the hard surface layer was not significantly damaged by etching. The resist pattern bearing the hard surface layer on its surface was subjected to ashing with $O_2$ plasma to find that the size of an opening in the SiN substrate was 145 nm, and no pin hole was observed.

EXAMPLE 5

The procedure of Example 4 was repeated, except for using the SiN substrate having the line-and-space pattern prepared according to Example 2 instead of the SiN substrate having the line-and-space pattern prepared according to Example 1. As a result, the resist pattern bearing the hard surface layer deposited on its surface was not significantly damaged by etching. The resist pattern bearing the hard surface layer on its surface was subjected to ashing with $O_2$ plasma to find that the size of an opening in the SiN substrate was 140 nm and no pin hole was observed.

EXAMPLE 6

The procedure of Example 4 was repeated, except for using the SiN substrate having the line-and-space pattern prepared according to Example 3 instead of the SiN substrate having the line-and-space pattern prepared according to Example 1. As a result, the resist pattern bearing the hard surface layer deposited on its surface was not significantly damaged by etching. The resist pattern bearing the hard surface layer on its surface was subjected to ashing with $O_2$ plasma to find that the size of an opening in the SiN substrate was 142 nm, and no pin hole was observed.

COMPARATIVE EXAMPLE 1

On a SiN substrate was formed a 150-nm line-and-space pattern using an alicyclic acrylic resist (ArF resist). An exposed area of the SiN substrate was etched 70 nm using a RIE system at a flow rate of $CHF_3$ of 20 sccm, a flow rate of $O_2$ of 20 sccm, a flow rate of Ar of 130 sccm, a pressure of 15 mT and an output of radio frequency of 200 W. As a result, the resist pattern of the alicyclic acrylic resist (ArF resist) was found to be damaged by etching. The resist pattern of the alicyclic acrylic resist (ArF resist) was subjected to ashing with $O_2$ plasma to find that the size of an opening in the SiN substrate was increased to 180 nm and some pin holes were observed. This is probably because the damaged portion of the resist pattern was etched.

EXAMPLE 7

Etching rates of samples were compared in the following manner. The hard surface layers deposited on the resist patterns on the SiN substrates according to Examples 1 to 3, a KrF resist (UV-6, available from Shipley Company, L.L.C) as a reference, a poly(methyl methacrylate) (PMMA), an alicyclic acrylic resist and a COMA resist as comparative samples were subjected to etching using an etching system (a in house made parallel plate RIE system), at Pμ of 200 W, a pressure of 0.02 Torr and a flow rate of $CF_4$ gas of 100 sccm for three minutes. The reductions in the samples were determined, the etching rates were calculated therefrom, and the etching rates of samples were compared with the etching rate of the KrF resist as the reference.

TABLE 1

| Material name | Etching rate (nm/s) | Ratio of etching rate (resist pattern/hard surface Layer) | Ratio of etching rate to KrF resist |
| --- | --- | --- | --- |
| UV-6 | 627 | — | 1.00 |
| PMMA | 770 | — | 1.23 |
| Alicyclic acrylic resist | 672 | — | 1.07 |
| COMA resist | 665 | — | 1.06 |
| Example 1 | 545 | 1.23 | 0.87 |
| Example 2 | 515 | 1.30 | 0.82 |
| Example 3 | 545 | 1.22 | 0.87 |

EXAMPLE 8

Flash Memory and Manufacture Thereof

Example 8 illustrates an embodiment of the semiconductor device and the manufacturing method thereof of the present invention using a surface-modified resist pattern of the present invention. In Example 8, resist films 26, 27, 29, 32 and 34 are surface-modified resist patterns formed by the method for forming a surface-modified resist pattern of the present invention.

Figure 9A:
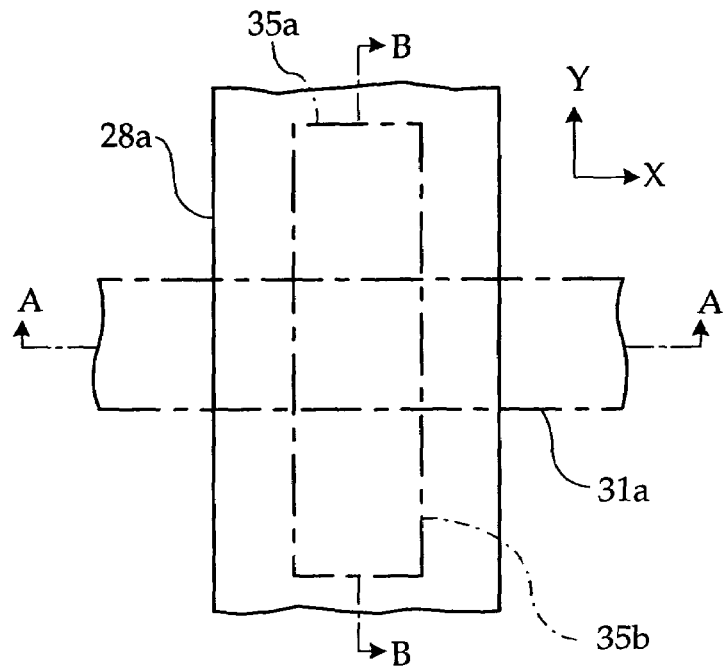
FIGS. 9A and 9B are top views illustrating a FLASH EPROM as an embodiment of the semiconductor device of the present invention.
Figure 9B:
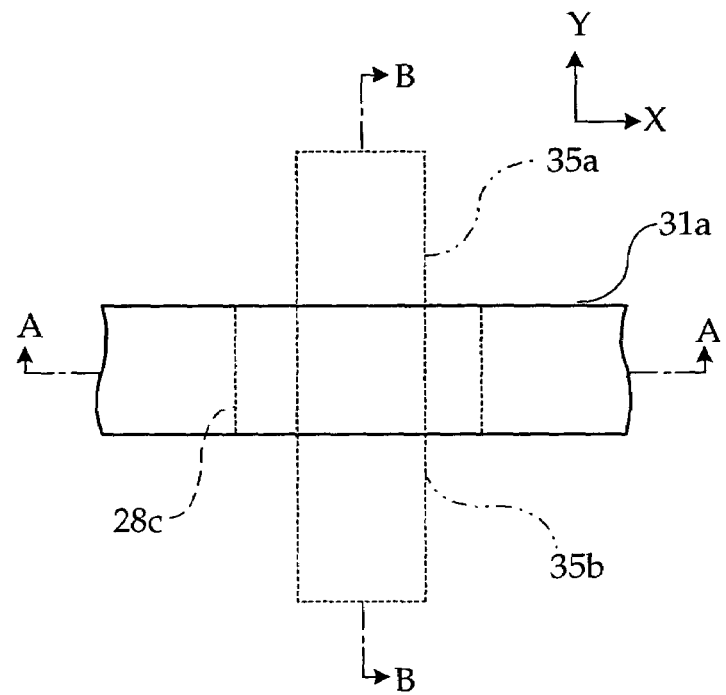

FIGS. 9A and 9B are top views (plan views) of a FLASH EPROM which is called a FLOTOX type or an ETOX type. FIGS. 10A, 10B, 10C, 11D, 11E, 11F, 12G, 12H, and 12I are schematic sectional views showing a manufacturing method of the FLASH EPROM. In these figures, the left views are schematic sectional views (sectional views taken along lines A-A) of a memory cell unit (a first element region), in a gate width direction (in the X direction in FIGS. 9A and 9B), in a portion where a MOS transistor having a floating gate electrode is to be formed. The central views are schematic sectional views (sectional views taken along lines B-B) of the memory cell unit in a gate length direction (in the Y direction in FIGS. 9A and 9B) perpendicular to the X direction in the same portion in the left views. The right views are schematic sectional views (sectional views taken along the line A-A in FIGS. 9A and 9B) of a portion on which a MOS transistor is to be formed in a peripheral circuit unit (a second element region).

Initially, a $SiO_2$ film was selectively formed in a device isolation region on a p-type Si substrate 22 and thereby yielded a field oxide film 23 of $SiO_2$ film (FIG. 10A). Next, a $SiO_2$ film was formed by thermal oxidation to a thickness of 100 to 300 angstroms as a first gate dielectric film 24a in the MOS transistor in the memory cell unit (first element region). In another step, a $SiO_2$ film was formed by thermal oxidation to a thickness of 100 to 500 angstroms as a second gate dielectric film 24b in the MOS transistor in the peripheral circuit unit (second element region). If the first gate dielectric film 24a and the second gate dielectric film 24b should have the same thickness, these oxide films may be simultaneously formed in one step.

Next, the peripheral circuit unit (the right view in FIG. 10A) was masked by a resist film 26 to control a threshold voltage for the formation of a MOS transistor having n-type depletion type channels in the memory cell unit (the left and central views in FIG. 10A). As an n-type dopant, phosphorus (P) or arsenic (As) was injected into a region to be a channel region directly below the floating gate electrode by ion implantation at a dose of $1 \times 10^{11}$ to $1 \times 10^{14}$ cm$^{-2}$ and thereby yielded a first threshold control layer 25a. The dose and conduction type of the dopant can be appropriately selected depending on whether the channel is a depletion type or an accumulation type.

Next, the memory cell unit (the left and central views in FIG. 10B) was masked by a resist film 27 to control a threshold voltage for the formation of a MOS transistor having n-type depletion type channels in the peripheral circuit unit (the right view in FIG. 10B). As an n-type dopant, phosphorus (P) or arsenic (As) was injected into a region to be a channel region directly below the gate electrode by ion implantation at a dose of $1 \times 10^{11}$ to $1 \times 10^{14}$ cm$^{-2}$ and thereby yielded a second threshold control layer 25b.

A first polysilicon film (first conductive film) 28 having a thickness of 500 to 2000 angstroms was formed on the entire surface of the article as a floating gate electrode of the MOS transistor of the memory cell unit (the left and central views in FIG. 10C) and as a gate electrode of the MOS transistor in the peripheral circuit unit (the right view in FIG. 10C).

Figures 11D, 11E, 11F:
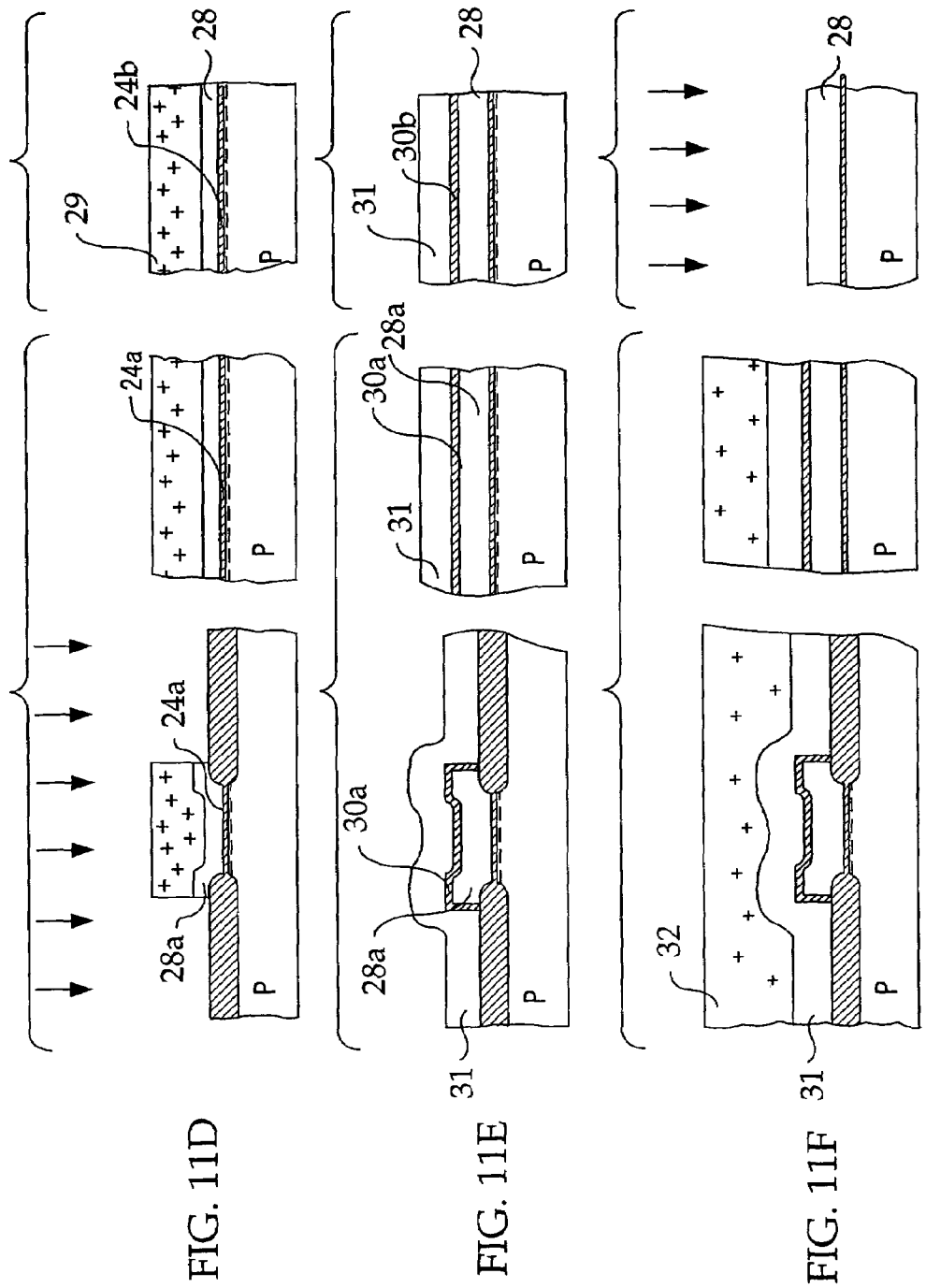
FIGS. 11D, 11E and 11F are schematic sectional views (part two) illustrating the method for manufacturing a FLASH EPROM as an embodiment of the method for manufacturing a semiconductor device of the present invention.

With reference to FIG. 11D, a resist film 29 was then formed, the first polysilicon film 28 was patterned using the resist film 29 as a mask and thereby yielded a floating gate electrode 28a in the MOS transistor in the memory cell unit (the left and central views in FIG. 11D). In this procedure, the first polysilicon film 28 was patterned in the X direction to be intended dimensions and was not patterned in the Y direction to thereby leave a region to be a source-drain (S/D) layer covered by the resist film 29.

The resist film 29 was stripped, a $SiO_2$ film having a thickness of about 200 to about 500 angstroms was formed by thermal oxidation and thereby yielded a capacitor dielectric film 30a so as to cover the floating gate electrode 28a (the left and central views in FIG. 11E). In this procedure, a capacitor dielectric film 30b made of a $SiO_2$ film was also formed on the first polysilicon film 28 in the peripheral circuit unit (the right view in FIG. 1E). These capacitor dielectric films 30a and 30b are made of a $SiO_2$ film alone but they may comprise a multilayer film having two or three layers of $SiO_2$ film and $Si_3N_4$ film.

Next, a second polysilicon film (second conductive film) 31 was formed to a thickness of 500 to 2000 angstroms so as to cover the floating gate electrode 28a and the capacitor dielectric film 30a (FIG. 11E). The second polysilicon film 31 serves as a control gate electrode.

With reference to FIG. 11F, the memory cell unit (the left and central views in FIG. 11F) was masked by a resist film 32, the second polysilicon film 31 and the capacitor dielectric film 30b in the peripheral circuit unit (the right view in FIG. 11F) were stripped in turn by etching to thereby expose the first polysilicon film 28 from the surface.

Figures 12G, 12H, 12I:
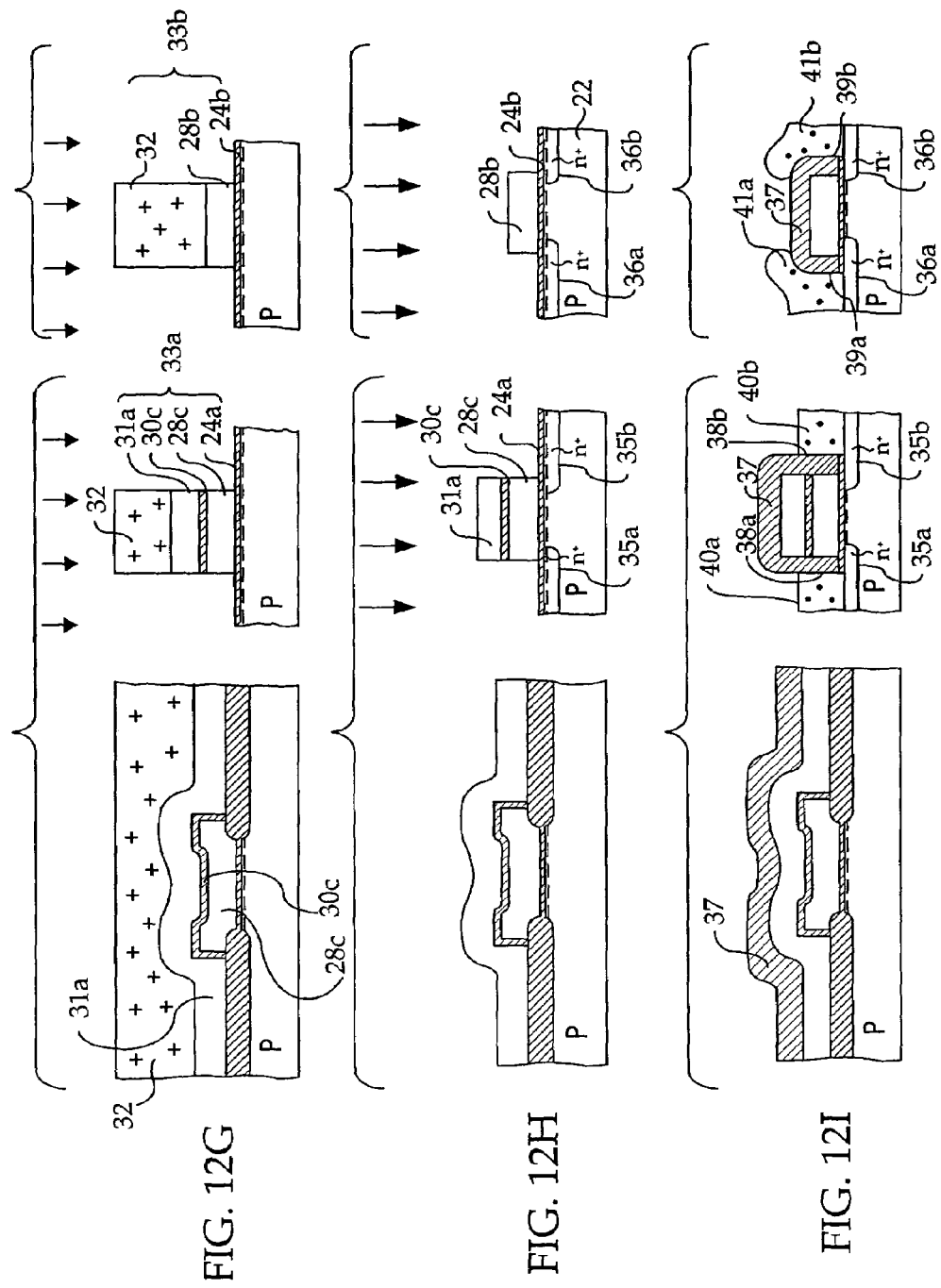
FIGS. 12G, 12H and 12I are schematic sectional views (part three) illustrating the method for manufacturing a FLASH EPROM as an embodiment of the method for manufacturing a semiconductor device of the present invention.

With reference to FIG. 12G, the second polysilicon film 31, the capacitor dielectric film 30a, and the first polysilicon film 28a of the memory cell unit (the left and central views in FIG. 12G), which first polysilicon film 28a had been patterned only in the X direction, were patterned in the Y direction to target dimensions of a first gate unit 33a using the resist film 32 as a mask. Thus, a multilayer assemblage of a control gate electrode 31a, a capacitor dielectric film 30c, and a floating gate electrode 28c having a width of about 1 µm in the Y direction was formed. In addition, the first polysilicon film 28 in the peripheral circuit unit (the right view in FIG. 12G) was patterned to target dimensions of a second gate unit 33b and thereby yielded a gate electrode 28b about 1 µm wide.

Phosphorus (P) or arsenic (As) was injected into the element forming region of the Si substrate 22 by ion implantation at a dose of $1 \times 10^{14}$ to $1 \times 10^{16}$ cm$^{-2}$ using, as a mask, the multilayer assemblage of the control gate electrode 31a, the capacitor dielectric film 30c, and the floating gate electrode 28c in the memory cell unit (the left and central views in FIG. 12H) and thereby yielded n-type source and drain (S/D) region layers 35a and 35b. In addition, phosphorus (P) or arsenic (As) as an n-type dopant was injected into the element forming region of the Si substrate 22 by ion implantation at a dose of $1\times10^{14}$ to $1\times10^{16}$ cm$^{-2}$ using the gate electrode 28b in the peripheral circuit unit (the right view in FIG. 12H) as a mask and thereby yielded S/D region layers 36a and 36b.

A phosphate-silicate glass film (PSG film) about 5000 angstroms thick was formed as an interlayer dielectric film 37 so as to cover the first gate unit 33a in the memory cell unit (the left and central views in FIG. 12I) and the second gate unit 33b in the peripheral circuit unit (the right view in FIG. 12I).

Subsequently, contact holes 38a, 38b, 39a, and 39b were formed on the interlayer dielectric film 37 on the S/D region layers 35, 35b, 36a, and 36b, respectively. S/D electrodes 40a, 40b, 41a and 41b were then formed respectively.

Thus, the FLASH EPROM as a semiconductor device was manufactured (FIG. 12I).

In the above-manufactured FLASH EPROM, the second gate dielectric film 24b in the peripheral circuit unit (the right views in FIGS. 10A through 11F) remains being covered by the first polysilicon film 28 or the gate electrode 28b after its formation (the right views in FIGS. 10C through 11F) and thereby keeps its initial thickness. Accordingly, the thickness of the second gate dielectric film 24b can be easily controlled, and the concentration of a conductive dopant can be easily controlled for the control of the threshold voltage.

In this embodiment, the first gate unit 33a is formed by initially patterning in the gate width direction (the X direction in FIGS. 9A and 9B) to a set width and then patterning in the gate length direction (the Y direction in FIGS. 9A and 9B) to a target width. Alternatively, the first gate unit 33a may be formed by initially patterning in the gate length direction (the Y direction in FIGS. 9A and 9B) to a set width and then patterning in the gate width direction (the X direction in FIGS. 9A and 9B) to a target width.

Figures 13A, 13B, 13C:
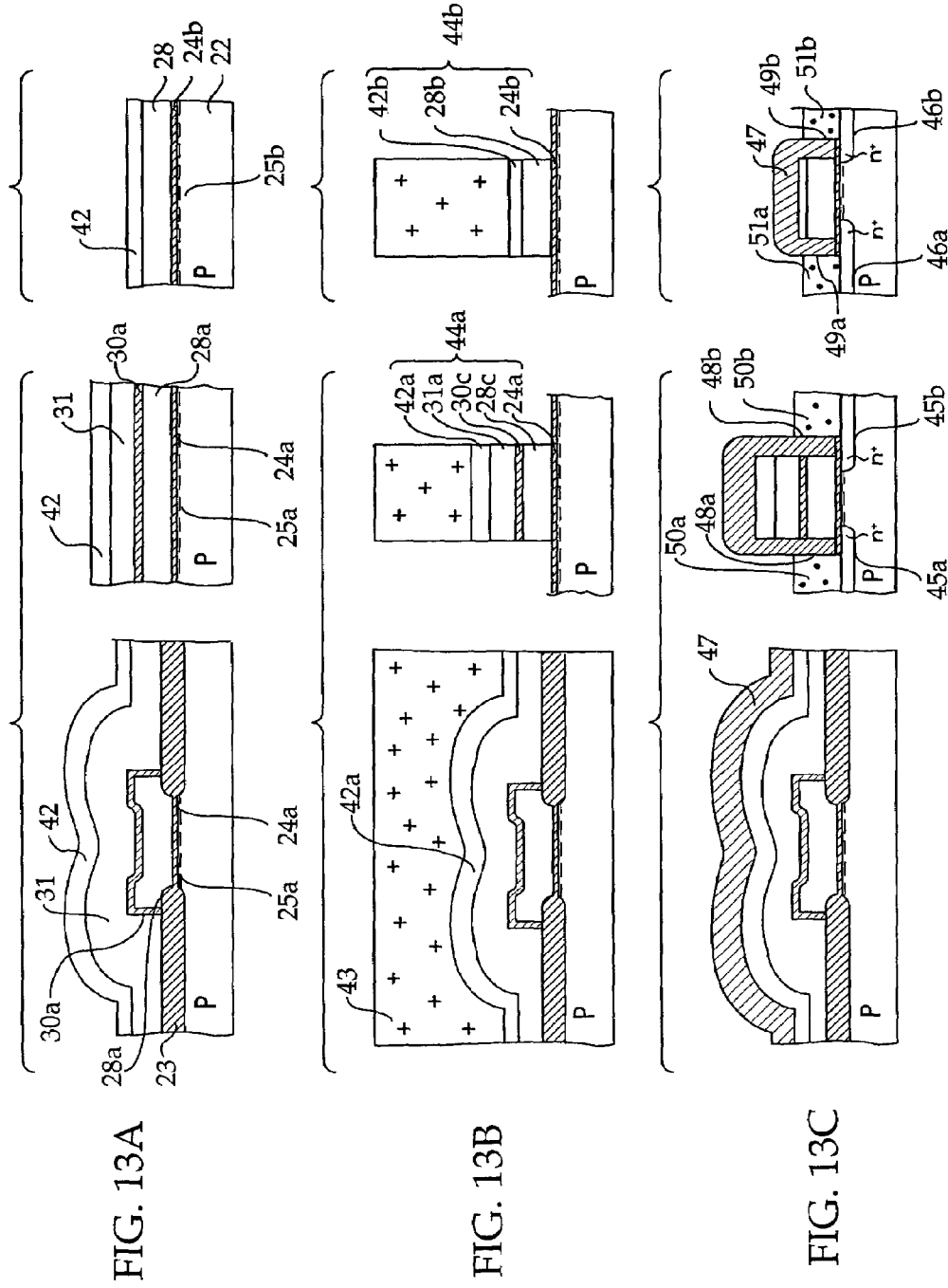
FIGS. 13A, 13B and 13C are schematic sectional views illustrating a method for manufacturing a FLASH EPROM as another embodiment of the method for manufacturing a semiconductor device of the present invention.

Another FLASH EPROM was manufactured in the same way as in the above embodiment, except that the steps subsequent to the step of FIG. 11F were changed to those shown in FIGS. 13A, 13B and 13C. This manufacture is similar to the above embodiment, except for the followings. Specifically, a tungsten (W) film or a titanium (Ti) film about 2000 angstroms thick was formed as a refractory metal film (fourth conductive film) 42 on the second polysilicon film 31 in the memory cell unit (the left and central views in FIG. 13A) and the first polysilicon film 28 in the peripheral circuit unit (the right view in FIG. 13A) and thereby yielded a polycide film. The steps of FIGS. 13B and 13C subsequent to the step of FIG. 13A were carried out in the same manner as in FIGS. 12G, 12H, and 12I and a detail description thereof is omitted. The same components in FIGS. 13A, 13B, and 13C as in FIGS. 12G, 12H, and 12I have the same reference numerals.

Thus, a FLASH EPROM as a semiconductor device was manufactured (FIG. 13C).

The above-manufactured FLASH EPROM has the refractory metal films (fourth conductive films) 42a and 42b on the control gate electrode 31a and the gate electrode 28b and can thereby further reduce its electrical resistance.

In this embodiment, the refractory metal films 42a and 42b are used as the fourth conductive films. Alternatively, refractory metal silicide films such as titanium silicide (TiSi) films can be used.

Yet another FLASH EPROM was manufactured by the manufacture procedure as in the above-mentioned embodiment, except for steps shown in FIGS. 14A, 14B, and 14C.

Specifically, a second gate unit 33c in the peripheral circuit unit (second element region) (the right view in FIG. 14A) has a multilayer structure comprising a first polysilicon film (first conductive film) 28b, a SiO$_2$ film (capacitor dielectric film) 30d, and a second polysilicon film (second conductive film) 31b arranged in this order as in the first gate unit 33a in the memory cell unit (the left and central views in FIG. 14A). The first polysilicon film 28b and the second polysilicon film 31b are bridged and thereby form a gate electrode (FIGS. 14B and 14C).

More specifically, with reference to FIG. 14B, the first polysilicon film 28b and the second polysilicon film 31b are bridged by forming an opening 52a penetrating the first polysilicon film (first conductive film) 28b, the SiO$_2$ film (capacitor dielectric film) 30d and the second polysilicon film (second conductive film) 31b at another portion than the second gate unit 33c shown in FIG. 14A, for example, on the dielectric film 54, and filling the opening 52a with a refractory metal film (third conductive film) 53a such as a W film or a Ti film. Alternatively, with reference to FIG. 14C, the first polysilicon film 28b and the second polysilicon film 31b may be bridged by forming an opening 52b penetrating the first polysilicon film (first conductive film) 28b and the SiO$_2$ film (capacitor dielectric film) 30d, thereby exposing the lower first polysilicon film 28b at the bottom of the opening 52b, and filling the opening 52b with a refractory metal film 53b such as a W film or a Ti film.

In the above-manufactured FLASH EPROM, the second gate unit 33c in the peripheral circuit unit has the same structure as the first gate unit 33a in the memory cell unit. Accordingly, the memory cell unit and the peripheral circuit unit can be formed by the same step to thereby efficiently simplify steps of the manufacture method.

In this embodiment, the third conductive film 53a or 53b and the refractory metal film (fourth conductive film) 42 were formed independently. Alternatively, these films may be formed simultaneously as a refractory metal film in common.

EXAMPLE 9

Manufacture of Magnetic Head

Example 9 relates to the manufacture of a magnetic head as an application embodiment of the surface-modified resist pattern formed by the method for forming a surface-modified resist pattern of the present invention. In Example 9, aftermentioned resist patterns 102 and 126 are surface-modified resist patterns formed by the method for forming a surface-modified resist pattern of the present invention.

FIGS. 15A, 15B, 15C, and 15D show processes for the manufacture of the magnetic head.

Figure 15A:
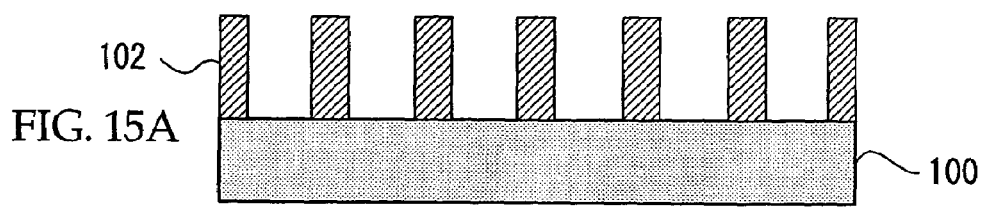
FIGS. 15A, 15B, 15C and 15D are schematic sectional views illustrating an embodiment in which a surface-modified resist pattern formed by the method for forming a surface-modified resist pattern of the present invention is applied to the manufacture of a magnetic head.

Initially, a resist film was formed to a thickness of 6 µm on an interlayer dielectric layer 100, was exposed to light, was developed and thereby yielded a resist pattern 102 having an opening pattern for the formation of a spiral thin film magnetic coil (FIG. 15A).

Figure 15B:
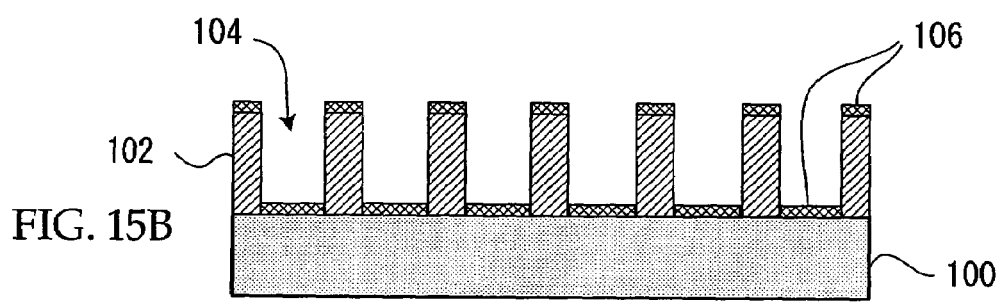

Next, a plated underlayer 106 comprising a multilayer structure comprising a Ti contact film 0.01 µm thick and a Cu contact film 0.05 µm thick was formed by vapor deposition on the resist pattern 102 and on the exposed surface of the interlayer dielectric layer 100 at the bottom of the opening 104 in a portion where the resist pattern 102 was not formed (FIG. 15B).

Figure 15C:
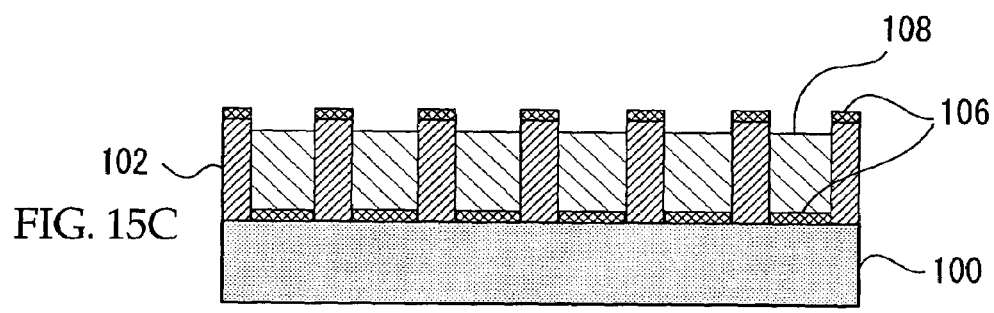

A Cu-plated film 3 µm thick as a thin-film conductor 108 was formed on the surface of the plated underlayer 106 above the exposed surface of the interlayer dielectric layer 100 at the bottom of the opening 104 in a portion where the resist pattern 102 was not formed (FIG. 15C).

Figure 15D:
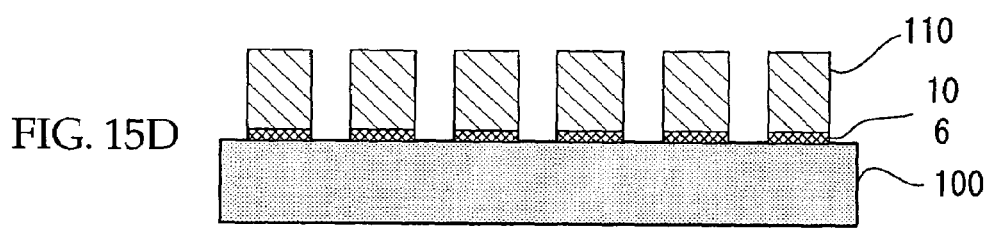

The resist pattern 102 was dissolved, was removed by lift-off from the interlayer dielectric layer 100 and thereby yielded a spiral thin-film magnetic coil 110 derived from the spiral pattern of the thin-film conductor 108 (FIG. 15D).

Thus, the magnetic head was manufactured.

The above-manufactured magnetic head has the thin film magnetic coil 110 in fine and high-definition dimensions, since the fine spiral pattern was formed by using the resist pattern 102 as the surface-modified resist pattern of the present invention. In addition, the magnetic head can be satisfactorily manufactured in mass production.

Another magnetic head was manufactured by processes shown in FIGS. 16 through 21.

Figure 16:
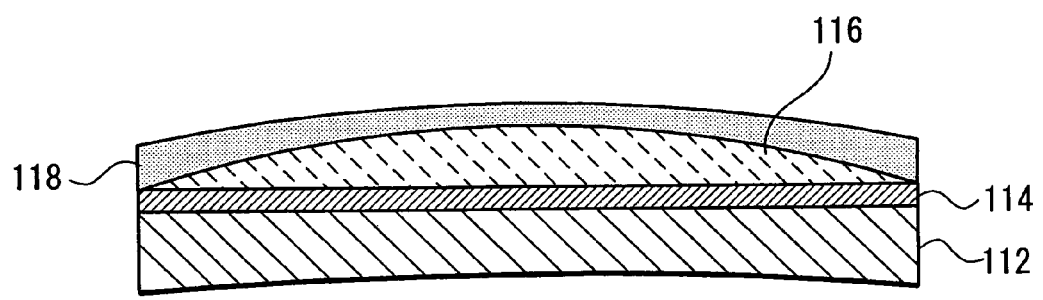
FIG. 16 is a schematic sectional view (part one) illustrating steps of another embodiment, in which a surface-modified resist pattern formed by the method for forming a surface-modified resist pattern of the present invention is applied to the manufacture of a magnetic head.

A gap layer 114 was formed by sputtering so as to cover a ceramic non-magnetic substrate 112 (FIG. 16). The non-magnetic substrate 112 had an insulating layer of silicon oxide, a conductive underlayer of a Ni—Fe Permalloy formed by sputtering, and a lower magnetic layer of a Ni—Fe permalloy formed in advance on its surface. These layers are not shown in the figures. A resin dielectric film 116 was formed from a thermosetting resin in a set region on the gap layer 114 except a region to be a magnetic tip (magnetic head) of the lower magnetic layer (not shown). A resist composition was then applied to the resin dielectric film 116 and thereby yielded a resist film 118.

Figure 17:
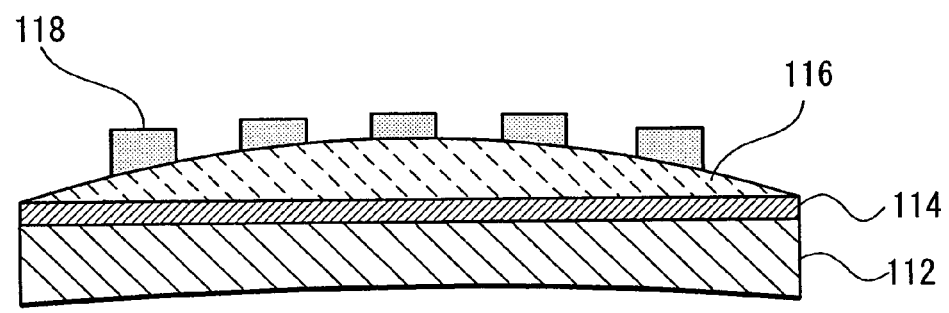
FIG. 17 is a schematic sectional view (part two) illustrating the steps of the embodiment, in which the surface-modified resist pattern formed by the method for forming a surface-modified resist pattern of the present invention is applied to the manufacture of a magnetic head.
Figure 18:
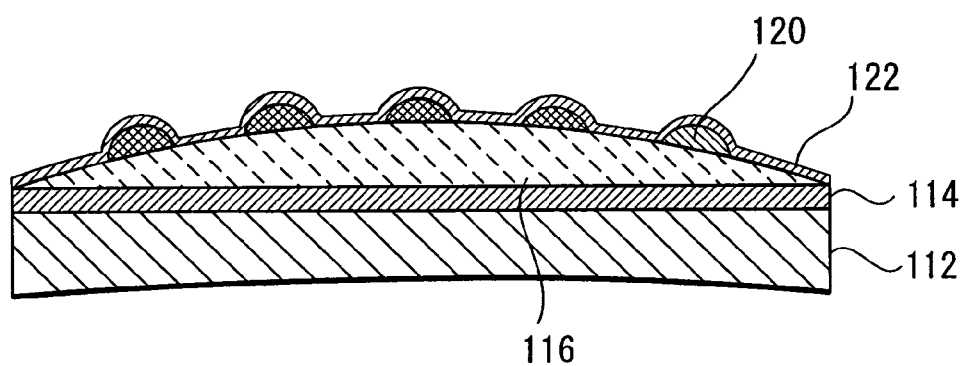
FIG. 18 is a schematic sectional view (part three) illustrating the steps of the embodiment, in which the surface-modified resist pattern formed by the method for forming a surface-modified resist pattern of the present invention is applied to the manufacture of a magnetic head.

The resist film 118 was exposed to light, was developed and thereby yielded a spiral pattern (FIG. 17). The spirally patterned resist film 118 was subjected to thermal curing at several hundred Celsius degrees for about one hour and thereby yielded a protruded first spiral pattern 120 (FIG. 18). A conductive underlayer 122 of Cu was formed so as to cover the surface of the first spiral pattern 120.

Figure 19:
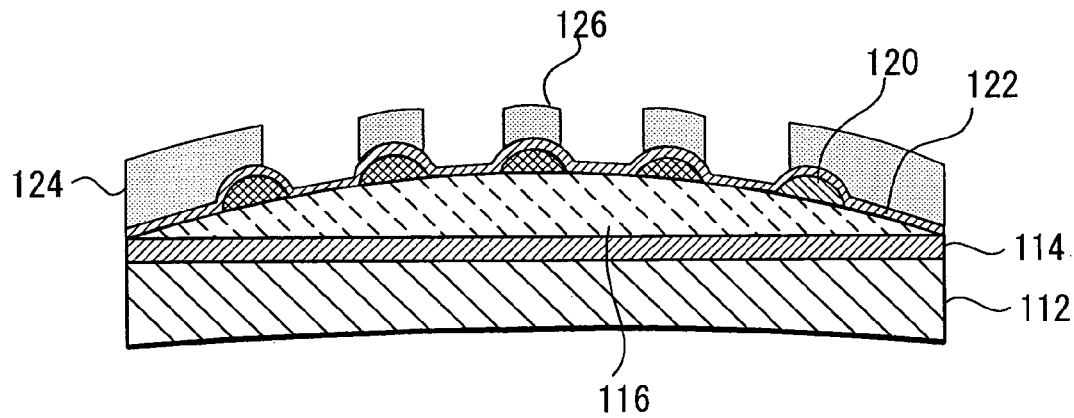
FIG. 19 is a schematic sectional view (part four) illustrating the steps of the embodiment, in which the surface-modified resist pattern formed by the method for forming a surface-modified resist pattern of the present invention is applied to the manufacture of a magnetic head.

A resist material was applied to the conductive underlayer 122 by spin coating and thereby yielded a resist film 124 thereon. Subsequently, the resist film 124 was patterned corresponding to the first spiral pattern 120 and thereby yielded a resist pattern 126 (FIG. 19).

Figure 20:
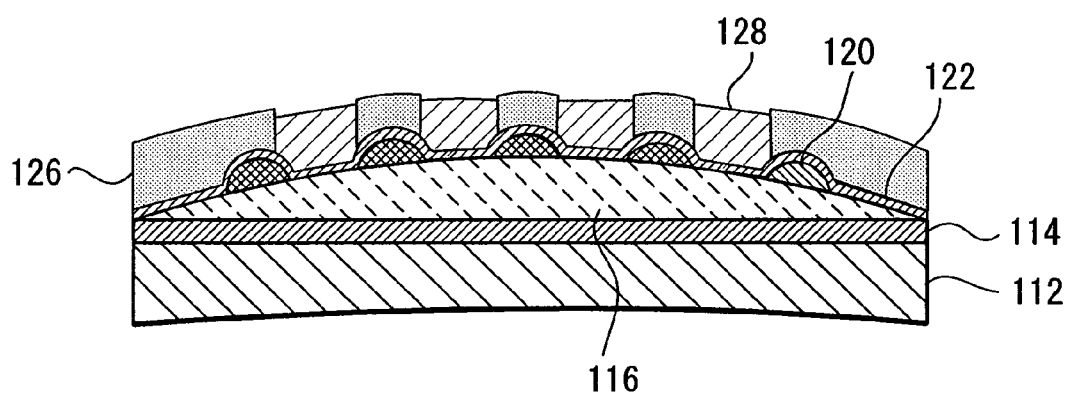
FIG. 20 is a schematic sectional view (part five) illustrating the steps of the embodiment, in which the surface-modified resist pattern formed by the method for forming a surface-modified resist pattern of the present invention is applied to the manufacture of a magnetic head.
Figure 21:
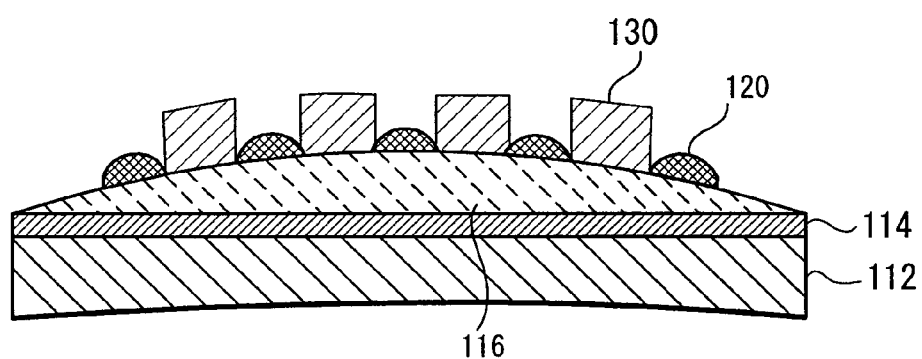
FIG. 21 is a schematic sectional view (part six) illustrating the steps of the embodiment, in which the surface-modified resist pattern formed by the method for forming a surface-modified resist pattern of the present invention is applied to the manufacture of a magnetic head.

A Cu conductive layer 128 was formed by plating on the exposed surface of the conductive underlayer 122 in a portion where the resist pattern 126 was not formed (FIG. 20). The resist pattern 126 was lifted off from the conductive underlayer 122 by dissolving and thereby yielded a spiral thin-film magnetic coil 130 derived from the Cu conductive layer 128 (FIG. 21).

Figure 22:
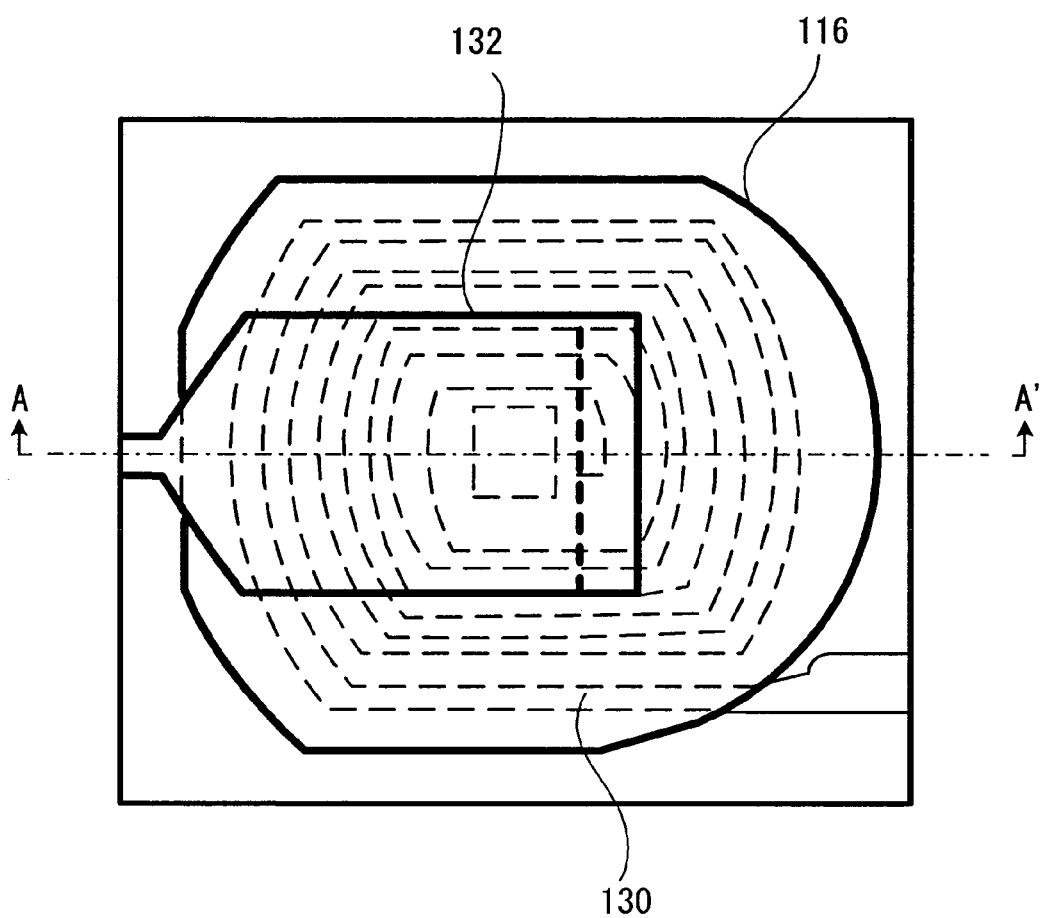
FIG. 22 is a plan view of an example of the magnetic head manufactured by the steps shown in FIGS. 16 to 21.

Thus, the magnetic head as shown in a plan view of FIG. 22 was manufactured. The magnetic head has a magnetic layer 132 on the resin dielectric film 116 with the thin-film magnetic coil 130 on its surface.

The above-manufactured magnetic head has the thin-film magnetic coil 130 in fine and high-definition dimensions, since the fine spiral pattern was formed by using the resist pattern 126 as the surface-modified resist pattern of the present invention. In addition, the magnetic head can be satisfactorily manufactured in mass production.

EXAMPLE 10

Manufacture of Semiconductor Device

Figure 23:
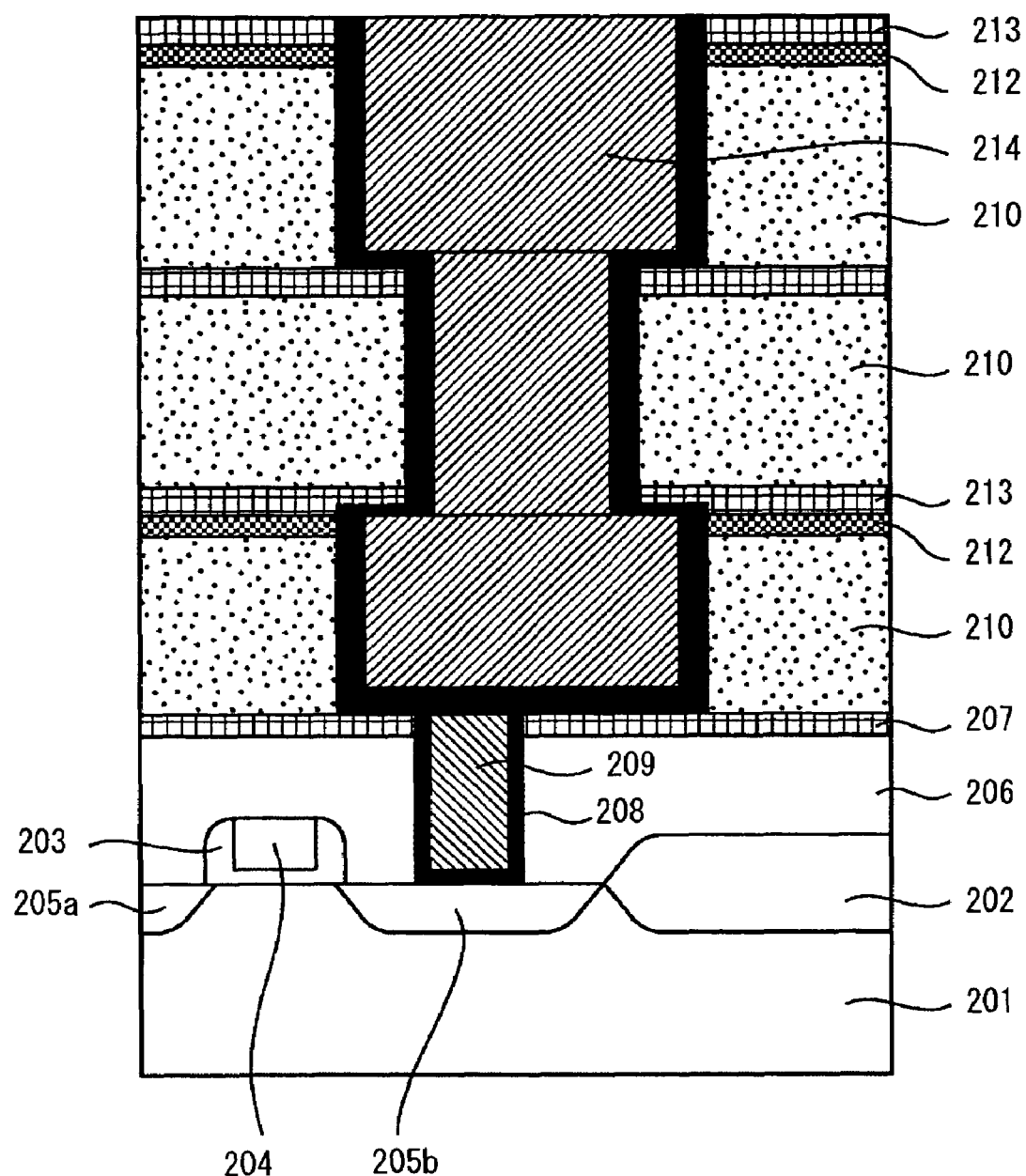
FIG. 23 is a schematic diagram illustrating an example of the semiconductor device of the present invention manufactured by using an etch-resistant film formed by the method for forming an etch-resistant film of the present invention.

With reference to FIG. 23, initially, an interlayer dielectric film 206 and a stopper film 207 were formed on a Si wafer 201, and a contact hole for extracting an electrode was formed therein. The Si wafer 201 had a transistor layer separated by an isolation film 202 and comprising a source diffusion layer 205a, a drain diffusion layer 205b and a gate electrode with a sidewall dielectric film 203. A titanium nitride (TiN) film 208 was formed to a thickness of 50 nm inside the contact hole by sputtering, a conductive plug (W) 209 was then embedded therein by mixing $WF_6$ and hydrogen to reduce $WF_6$, followed by removal of the other portion than via holes by chemical-mechanical polishing (CMP).

Next, a low-permeability dielectric film 210 was formed as an etch-resistant film prepared by the method for forming an etch-resistant film of the present invention to a thickness of 450 nm on a Si plate, and a TEOS-$SiO_2$ film 212 serving as a cap film was formed thereon to a thickness of 50 nm. The cap film 212 was patterned as a first-layer wiring pattern by processing with fluorine plasma using a $CF_4/CHF_3$ gas as a raw material and a resist layer as a mask.

A titanium nitride (TiN) film 208 serving as a barrier against the diffusion of copper (Cu) into the dielectric layer, and a Cu seed layer serving as an electrode in electroplating were formed on the wiring gutter each to a thickness of 50 nm by sputtering. A copper (Cu) layer 214 was formed to a thickness of 600 nm in the resulting wiring gutter by electroplating, followed by removal of the metals other than the wiring pattern by chemical-mechanical polishing (CMP), to form a wiring layer.

A dual damascene method for forming a via hole layer and a wiring layer simultaneously will be illustrated below. A silicon nitride (SiN) film 213 was formed on the first-layer wiring layer to a thickness of 50 nm by plasma CVD using silane and ammonia gases. A low-permeability dielectric film 210 was formed thereon to a thickness of 650 nm as the etch-resistant film according to the method for forming an etch-resistant film of the present invention. The SiN film 213 serves as an anti-scatter film for preventing diffusion of Cu. In a region corresponding to a wiring layer, a silicon nitride (SiN) film 207 serving as a stopper film was formed to a thickness of 50 nm on the Si plate by plasma CVD using silane and ammonia gases. A low-permeability dielectric film 210 was formed to a thickness of 40 nm as an etch-resistant film according to the method for forming an etch-resistant film of the present invention. Then, a cap film 212 was formed from tetraethylorthosillicate (TEOS)-$SiO_2$ to a thickness of 50 nm. By using a resist layer having a via hole pattern as a mask, the $SiO_2$ film, the low-permeability dielectric film, the SiN film, the low-permeability dielectric film and the SiN film were processed in this order by fluorine plasma using $CF_4$ and $CHF_3$ gases as raw materials at a varying gas composition. Using a resist layer having a second-layer wiring pattern as a mask, processing was further carried out by fluorine plasma using $CF_4$ and $CHF_3$ gases as raw materials. In the resulting via hole and the wiring gutter, a titanium nitride (TiN) film 208 and a copper (Cu) seed layer were formed by sputtering each to a thickness of 50 nm. The TiN film 208 serves as a barrier against diffusion of Cu into the dielectric layers. The Cu seed layer serves as an electrode in electroplating. A copper (Cu) layer 214 was formed by electroplating to a thickness of 1400 nm, the metals in other regions than the wiring pattern were removed by CMP to thereby form a wiring layer. The other regions than the via hole were removed by chemical-mechanical polishing (CMP) to thereby form a via hole layer. These steps were repeated and thereby yielded a 203-layered wiring.

In the resulting semiconductor device, the multilayer wiring achieved a yield of 90% or more of one million continuous via holes.

The present invention can provide an etch-resistant film that can be suitably arranged typically as a masking material against etching on an underlying layer (workpiece surface) having low etch resistance, and a method for efficiently forming the same.

The present invention can also provide a surface-modified resist pattern which contains a resist pattern having low etch resistance but having a modified and etch-resistant surface and is suitable for fine and high-definition patterning, and a method for efficiently forming the same.

In addition, the present invention can provide a semiconductor device having a fine and high-definition wiring pattern and exhibiting high performance and high quality, and a method for efficiently manufacturing the same.

What is claimed is:

1. A method for forming a surface-modified resist pattern having an etch-resistant surface, by using plasma, comprising:
    forming a resist pattern having a wall on a substrate; and then selectively depositing an organic compound on the resist pattern, wherein the organic compound is deposited on the horizontal surface of the resist pattern, without being deposited on the wall of the resist pattern and the substrate.

2. A method for manufacturing a semiconductor device, comprising the steps of:
    forming a resist pattern having a wall on an underlying layer,
    and then by selectively depositing an organic compound on the resist pattern to thereby form a surface-modified resist pattern;
    and patterning the underlying layer by etching using the surface-modified resist pattern as a mask,
    wherein the organic compound is deposited on the top of the resist pattern without being deposited on the wall of the resist pattern and the underlying layer.

3. A method for forming a surface-modified resist pattern having an etch-resistant surface, comprising the steps of:
    contacting plasma with an organic compound deposited on a base material, which has etch resistance;
    releasing the organic compound from the base material;
    and then selectively depositing the organic compound on a resist pattern, formed on an underlying layer, the resist pattern having a wall,
    wherein the organic compound is deposited on the top of the resist pattern without being deposited on the wall of the resist pattern and the underlying layer.

4. A method for forming a surface-modified resist pattern according to claim 3, wherein the base material is arranged above the resist pattern, and the organic compound is released toward the resist pattern located below the base material.

5. A method for forming a surface-modified resist pattern according to claim 3, wherein the organic compound deposited on the base material is arranged so as to face the resist pattern, and the plasma is introduced from an opposite side of the base material to the organic compound deposited thereon.

6. A method for forming a surface-modified resist pattern according to claim 3, wherein the organic compound has etch resistance and contains at least one of a cyclic hydrocarbon structure and a heterocyclic structure.

7. A method for forming a surface-modified resist pattern according to claim 3, wherein the organic compound is at least one selected from the group consisting of novolak resins, polyvinyiphenol resins and polystyrene resins.

8. A method for forming a surface-modified resist pattern according to claim 3, wherein the base material has at least one patterned through hole.

9. A method for forming a surface-modified resist pattern according to claim 3, wherein the resist pattern comprises at least one nonaromatic resin.

10. A method for forming a surface-modified resist pattern according to claim 3, wherein the at least one nonaromatic resin is selected from the group consisting of acrylic resins, norbornene resins and fluorine-containing resins.

11. A method for forming a surface-modified resist pattern according to claim 3, the step of selectively depositing is carried out using plasma of a plasmatic source gas.

12. A method for forming a surface-modified resist pattern according to claim 11, wherein the gas is one selected from oxygen, Freon, argon and nitrogen.

13. A method for forming an etch-resistant film, comprising the steps of:
    contacting plasma with an organic compound deposited on a base material, which has etch resistance;
    releasing the organic compound from the base material;
    and then selectively depositing the organic compound on the horizontal surface of a workpiece,
    wherein the workpiece is a resist pattern formed on an underlying layer,
    the resist pattern having a wall, wherein the organic compound is not deposited on the wall of the resist pattern and the underlying layer.

14. A method for forming an etch-resistant film according to claim 13, wherein the base material is arranged above the workpiece, and the organic compound is released toward the workpiece located below the base material.

15. A method for forming an etch-resistant film according to claim 13, wherein the organic compound deposited on the base material is arranged so as to face the workpiece, and the plasma is introduced from an opposite side of the base material to the organic compound deposited thereon.

16. A method for forming an etch-resistant film according to claim 13, wherein the organic compound has etch resistance and contains at least one of a cyclic hydrocarbon structure and a heterocyclic structure.

17. A method for forming an etch-resistant film according to claim 13, wherein the workpiece is one of a resist film and a resist pattern.

18. A method for forming an etch-resistant film according to claim 13, wherein the step of selectively depositing is carried out using plasma of a dielectric gas.

* * * * *